US009136380B2

(12) United States Patent
Yilmaz et al.

(10) Patent No.: US 9,136,380 B2
(45) Date of Patent: *Sep. 15, 2015

(54) DEVICE STRUCTURE AND METHODS OF MAKING HIGH DENSITY MOSFETS FOR LOAD SWITCH AND DC-DC APPLICATIONS

(71) Applicant: Alpha and Omega Semiconductor Incorporated, Sunnyvale, CA (US)

(72) Inventors: Hamza Yilmaz, Saratoga, CA (US); Madhur Bobde, Sunnyvale, CA (US); Hong Chang, Saratoga, CA (US); Yeeheng Lee, San Jose, CA (US); Daniel Calafut, San Jose, CA (US); Jongoh Kim, Portland, OR (US); Sik Lui, Sunnyvale, CA (US); John Chen, Palo Alto, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/329,806

(22) Filed: Jul. 11, 2014

(65) Prior Publication Data

US 2014/0339630 A1   Nov. 20, 2014

Related U.S. Application Data

(62) Division of application No. 13/724,180, filed on Dec. 21, 2012, now Pat. No. 8,809,948.

(51) Int. Cl.
*H01L 29/66* (2006.01)
*H01L 29/78* (2006.01)
(Continued)

(52) U.S. Cl.
CPC .......... *H01L 29/7827* (2013.01); *H01L 29/401* (2013.01); *H01L 29/41766* (2013.01);
(Continued)

(58) Field of Classification Search
CPC ......... H01L 29/76; H01L 21/76; H01L 29/00; H01L 31/11; H01L 27/095; H01L 31/062; H01L 31/113; H01L 29/78

USPC ........ 257/133–137, 329, 334, 280, 341, 471, 257/332, 139, E21.159, E27.06, E21.41, 257/E21.158, E21.419, E29.26, E21.54, 257/E29.262, E21.409; 438/270, 258, 589, 438/211, 257

See application file for complete search history.

(56) References Cited

U.S. PATENT DOCUMENTS 4,941,026 A * 7/1990 Temple .......................... 257/333
5,998,833 A * 12/1999 Baliga ........................... 257/329
(Continued)

OTHER PUBLICATIONS

Non-Final Office Action for U.S. Appl. No. 13/926,880, dated Mar. 17, 2015.
(Continued)

*Primary Examiner* — Yuanda Zhang
*Assistant Examiner* — Sheikh Maruf
(74) *Attorney, Agent, or Firm* — Joshua D. Isenberg; JDI Patent

(57) ABSTRACT

Aspects of the present disclosure describe a high density trench-based power MOSFETs with self-aligned source contacts and methods for making such devices. The source contacts are self-aligned with spacers that are formed along the sidewall of the gate caps. Additionally, the active devices may have a two-step gate oxide. A lower portion may have a thickness that is larger than the thickness of an upper portion of the gate oxide. The two-step gate oxide combined with the self-aligned source contacts allow for the production of devices with a pitch in the deep sub-micron level. It is emphasized that this abstract is provided to comply with rules requiring an abstract that will allow a searcher or other reader to quickly ascertain the subject matter of the technical disclosure. It is submitted with the understanding that it will not be used to interpret or limit the scope or meaning of the claims.

10 Claims, 25 Drawing Sheets

(51) Int. Cl.
*H01L 29/423* (2006.01)
*H01L 29/40* (2006.01)
*H01L 29/417* (2006.01)
*H01L 29/45* (2006.01)
*H01L 29/06* (2006.01)
*H01L 29/08* (2006.01)
*H01L 29/10* (2006.01)

(52) U.S. Cl.
CPC ...... *H01L29/4236* (2013.01); *H01L 29/42368* (2013.01); *H01L 29/66719* (2013.01); *H01L 29/66727* (2013.01); *H01L 29/66734* (2013.01); *H01L 29/7808* (2013.01); *H01L 29/7811* (2013.01); *H01L 29/7813* (2013.01); *H01L 29/0619* (2013.01); *H01L 29/0856* (2013.01); *H01L 29/0865* (2013.01); *H01L 29/0869* (2013.01); *H01L 29/1095* (2013.01); *H01L 29/456* (2013.01); *H01L 29/6656* (2013.01)

(56) References Cited

U.S. PATENT DOCUMENTS

| | | | |
|---|---|---|---|
| 6,251,730 B1 | 6/2001 | Luo | |
| 7,109,552 B2 | 9/2006 | Wu | |
| 7,361,557 B2 | 4/2008 | Inagawa et al. | |
| 7,691,706 B2 | 4/2010 | Kim | |
| 7,910,439 B2 | 3/2011 | Darwish et al. | |
| 8,252,647 B2 | 8/2012 | Lee et al. | |
| 8,466,513 B2 | 6/2013 | Grivna et al. | |
| 8,575,695 B2 | 11/2013 | Bobde et al. | |
| 8,664,065 B2 | 3/2014 | Grivna | |
| 8,710,582 B2 | 4/2014 | Okumura et al. | |
| 8,753,935 B1 | 6/2014 | Bobde et al. | |
| 8,809,948 B1 | 8/2014 | Yilmaz et al. | |
| 2003/0127702 A1 | 7/2003 | Blair et al. | |
| 2004/0014451 A1 | 1/2004 | Sapp et al. | |
| 2005/0062124 A1 | 3/2005 | Chiola | |
| 2005/0161758 A1 | 7/2005 | Chiola | |
| 2006/0249785 A1* | 11/2006 | Bhalla et al. | 257/328 |
| 2007/0134884 A1 | 6/2007 | Kim et al. | |
| 2008/0073707 A1* | 3/2008 | Darwish | 257/330 |
| 2008/0197408 A1 | 8/2008 | Disney et al. | |
| 2008/0283956 A1 | 11/2008 | Hshieh et al. | |
| 2009/0008706 A1 | 1/2009 | Yedinak et al. | |
| 2009/0224312 A1 | 9/2009 | Taketani | |
| 2009/0309156 A1* | 12/2009 | Darwish et al. | 257/332 |
| 2009/0315083 A1* | 12/2009 | Pan et al. | 257/280 |
| 2010/0001331 A1 | 1/2010 | Mikasa | |
| 2010/0187642 A1 | 7/2010 | Grivna | |
| 2011/0049596 A1 | 3/2011 | Lee et al. | |
| 2011/0177662 A1* | 7/2011 | Yilmaz et al. | 438/270 |
| 2011/0177663 A1 | 7/2011 | Kachi | |
| 2011/0284955 A1 | 11/2011 | Sapp et al. | |
| 2012/0146090 A1* | 6/2012 | Lui et al. | 257/139 |
| 2012/0220091 A1 | 8/2012 | Challa et al. | |
| 2012/0276701 A1 | 11/2012 | Yedinak et al. | |
| 2012/0292693 A1* | 11/2012 | Lee et al. | 257/330 |
| 2013/0168761 A1* | 7/2013 | Hsieh | 257/330 |
| 2013/0248995 A1 | 9/2013 | Nishiwaki et al. | |
| 2014/0048846 A1 | 2/2014 | Lui et al. | |
| 2014/0170823 A1 | 6/2014 | Lin | |
| 2014/0175536 A1 | 6/2014 | Lee et al. | |
| 2014/0239382 A1 | 8/2014 | Bobde et al. | |
| 2014/0239388 A1 | 8/2014 | Lee et al. | |
| 2014/0339630 A1 | 11/2014 | Yilmaz et al. | |

OTHER PUBLICATIONS

Non-Final Office Action for U.S. Appl. No. 14/606,928, dated Apr. 10, 2015.

Notice of Allowance for U.S. Appl. No. 13/776,523, dated Apr. 6, 2015.

Notice of Allowance for U.S. Appl. No. 13/724,180, dated Jun. 4, 2014.

Co-Pending U.S. Appl. No. 14/566,294, to Madhur Bobde, filed Dec. 10, 2014.

Non-Final Office Action for U.S. Appl. No. 13/776,523, dated Sep. 25, 2014.

Notice of Allowance for U.S. Appl. No. 14/270,228, dated Sep. 11, 2014.

Notice of Allowance for U.S. Appl. No. 13/724,228, dated Sep. 19, 2014.

Non-Final Office Action for U.S. Appl. No. 14/566,294, dated Jul. 14, 2015.

Notice of Allowance for U.S. Appl. No. 14/606,928, dated Jul. 1, 2015.

* cited by examiner

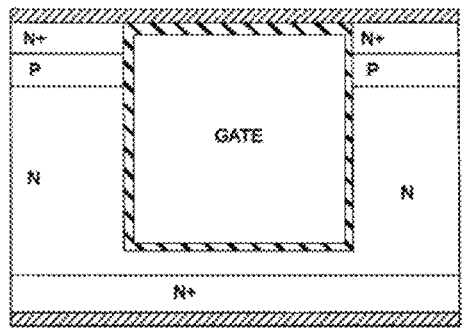 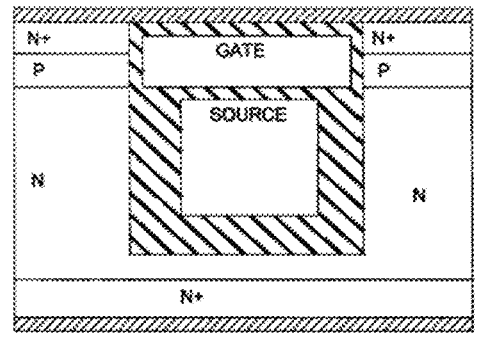
FIG. 1A (Prior Art)  FIG. 1B (Prior Art)
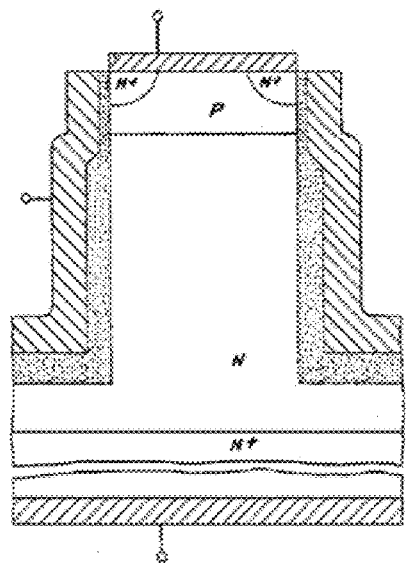
FIG. 1C (Prior Art)

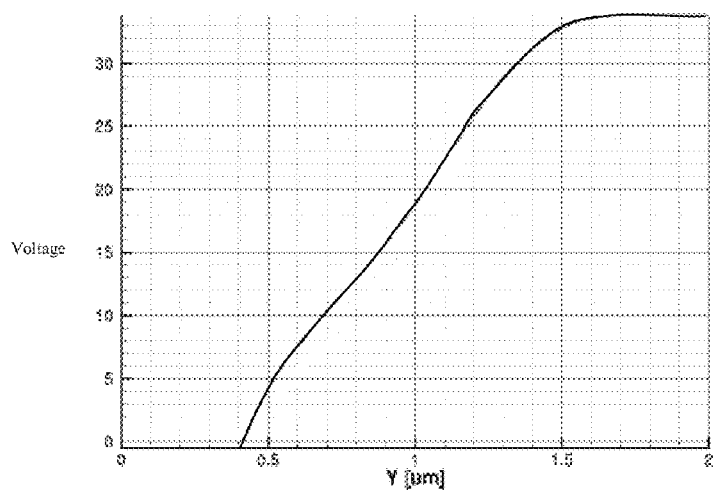
FIG. 2B
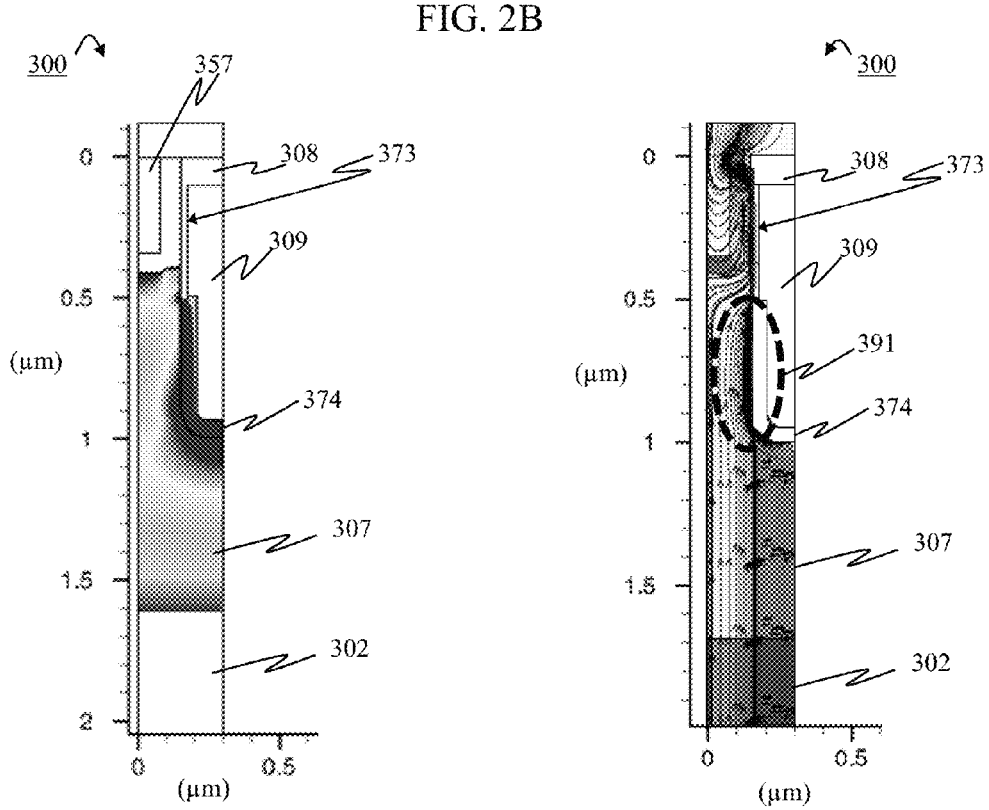
FIG. 2A
FIG. 2C

DEVICE STRUCTURE AND METHODS OF MAKING HIGH DENSITY MOSFETS FOR LOAD SWITCH AND DC-DC APPLICATIONS

CLAIM OF PRIORITY

This application is a divisional of commonly-assigned, co-pending U.S. patent application Ser. No. 13/724,180, filed Dec. 21, 2012, the entire disclosures of which are incorporated herein by reference.

CROSS-REFERENCE TO RELATED APPLICATIONS

This application is related to commonly-assigned, co-pending application Ser. No. 13/724,228, filed Dec. 21, 2012 and entitled "HIGH DENSITY TRENCH-BASED POWER MOSFETS WITH SELF-ALIGNED ACTIVE CONTACTS AND METHOD OF MAKING SUCH DEVICES" to Lee, Chang, Kim, Lui, Yilmaz, Bobde, Calafut, and Chen, the entire disclosures of which are incorporated herein by reference.

This application is related to commonly-assigned, application Ser. No. 13/724,093, now U.S. Pat. No. 8,753,935, filed Dec. 21, 2012 and entitled "HIGH FREQUENCY SWITCHING MOSFETS WITH A LOW OUTPUT CAPACITANCE USING A DEPLETABLE P-SHIELD" to Bobde, Yilmaz, Lui, and Ng, the entire disclosures of which are incorporated herein by reference.

FIELD OF THE INVENTION

This invention generally relates to metal oxide silicon field effect transistors (MOSFETs) and more particularly to high density trench based power MOSFETS.

BACKGROUND OF THE INVENTION

Low voltage power MOSFETs are often used in load switching applications. In load switching applications it is desirable to reduce the on-resistance ($R_{ds}$) of the device. Specifically, the $R_{dsA}$ of the device needs to be minimized, where $R_{dsA}$ is the on-resistance of the device multiplied by the active area of the device. Additionally, low voltage power MOSFETs are commonly used in high frequency DC-DC applications. In such applications it is often desirable to maximize the device's switching speed. Three of the most important parameters for optimizing the switching speed are: 1) $R_{ds} \times Q_g$; 2) $R_{ds} \times Q_{OSS}$; and 3) the ratio of $Q_{gd}/Q_{gs}$. First, the product of the $R_{ds}$ and the gate charge ($Q_g$) is a measure of the device conduction and switching losses together. $Q_g$ is the sum of the gate to drain charge ($Q_{gd}$) and the gate to source charge ($Q_{gs}$). In the second parameter, $Q_{OSS}$ is a measure of the capacitances that need to be charged and discharged whenever the device is switched on or off. Finally, minimizing the ratio of $Q_{gd}/Q_{gs}$ reduces the possibility of the device turning on due to a large dV/dt when the device is being switched off.

Trench based MOSFETs, as shown in FIG. 1A, were designed in part in order to reduce $R_{dsA}$ of the device. The design of trench based MOSFETs allowed for the removal of the JFET structure that was present in planar MOSFETs. By eliminating the JFET, the cell pitch could be reduced. However, the basic trench based MOSFET does not have any charge balancing in the drift regions, and therefore causes an increase in the $R_{dsA}$. Also, the relatively thin gate oxide generates a high electric field under the trench, which leads to a lower breakdown voltage. Low doping concentrations are needed in the drift region in order to support the voltage, and this increases the $R_{dsA}$ for structures with thinner gate oxides. Further, as cell pitch continues to decrease, the trench based MOSFET may become a less desirable choice because of the difficulty in reducing the thickness of the gate oxide further.

Previous attempts have been made to solve these problems through various designs. A first example is a shielded gate MOSFET as shown in FIG. 1B and described in U.S. Pat. No. 5,998,833 to Baliga. The use of a trench-based shield electrode connected to source potential instead of a larger gate electrode reduces the gate-to-drain capacitance ($C_{gd}$) of the MOSFET and improves switching speed by reducing the amount of gate charging and discharging needed during high frequency operation. However, the MOSFET device described by Baliga exhibits a high output capacitance because the source potential is capacitively coupled to the drain via the shield electrode. Also, in order to sustain the blocking voltage a thick oxide is required. Finally, complex processing is required in order to produce two electrically separated polysilicon electrodes within the same trench. The complexity of the fabrication is further accentuated when the pitch of the device is scaled downwards to the deep sub-micron level.

Finally, the MOSFET design shown in FIG. 1C and described in U.S. Pat. No. 4,941,026 to Temple, has certain characteristics that may be utilized to optimize the switching characteristics of a device. The device in Temple utilizes a two-step gate oxide with a thin layer of oxide near the top of the gate and a thicker layer of oxide in the bottom portion of the gate in order to create a device that has a low channel resistance and a low drift resistance. The thin upper portion of the gate oxide provides good coupling between the gate and body region which generates a strong inversion and low on-resistance in a channel next to the thin upper portion. The thicker gate oxide on the bottom creates a charge balancing effect and allows for the drift region to have an increased doping concentration. A higher doping concentration in the drift region decreases its resistance.

However, the device shown in FIG. 1C is not easily downwards scalable because it is highly susceptible to body contact misalignment errors. For example, if the pitch of the devices was scaled to the deep sub-micron level e.g., 0.5-0.6 µm, then the contact mask misalignment, relative to the gate, may greatly alter the characteristics of the device. In order to provide a good ohmic contact to the body region, an ohmic contact that is highly doped with dopants of the same conductivity type as the body region may be implanted after the contact mask has been used. If the contact mask is aligned too close to the gate, namely not landing exactly at the center of the silicon mesa, then highly doped implants used to generate an ohmic contact with the body may end up in the channel. If the highly doped ohmic region is in the channel, then the threshold voltage and the on-resistance of the device will be impacted. Also, if the contact mask is aligned too far away from the gate, then the turn on of the bipolar junction transistor (BJT) becomes an issue. Since the contact is further from the trench, the length of the body region is increased and therefore so is its resistance. As the resistance of the body region increases, it increases the voltage drop across the body region. The larger voltage drop across the body region will make it easier for the parasitic BJT to turn on and ruin the device.

Therefore, in order to fabricate deep sub-micron devices that are optimized for use as load switches and high frequency DC-DC applications there is a need for a device and method capable of self-aligning the contacts to the gate in order to prevent the aforementioned side effects.

It is within this context that embodiments of the present invention arise.

BRIEF DESCRIPTION OF THE DRAWINGS

FIGS. 1A-1C are prior art MOSFET devices.

FIGS. 2A-2C are diagrams and a graph that explain the electrical characteristics of the MOSFET devices according to aspects of the present disclosure.

DESCRIPTION OF THE SPECIFIC EMBODIMENTS

Figure 3A:
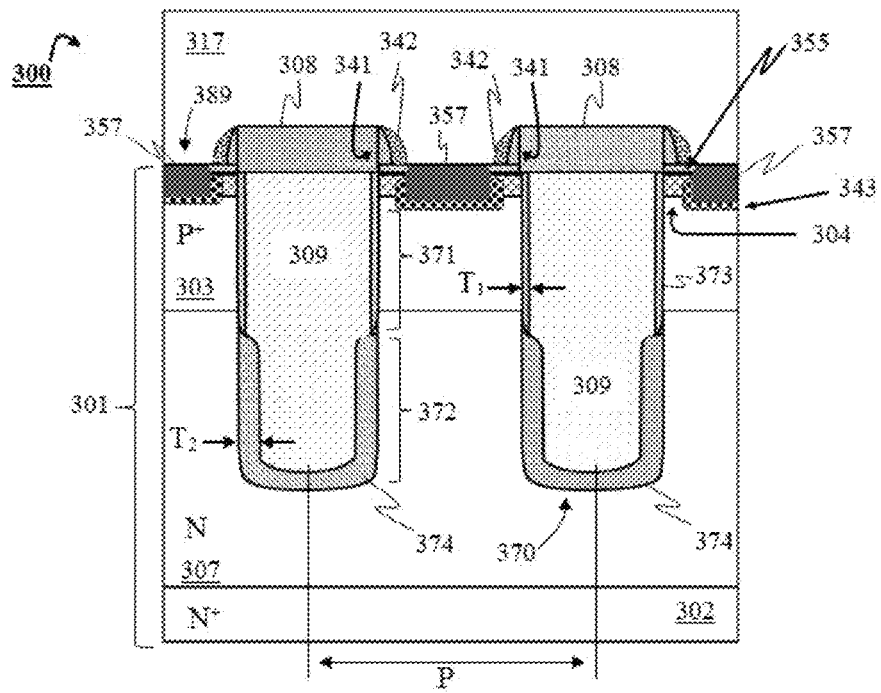
FIGS. 3A-3E are cross-sectional diagrams of several MOSFET devices according to aspects of the present disclosure.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. In the following discussion, an N-type device is described for purposes of illustration. P-type devices may be fabricated using a similar process but with opposite conductivity types.

Aspects of the present disclosure describe a high density trench-based power MOSFET with self-aligned source and body contacts. The source/body contacts may be self-aligned with conductive or semiconductor (e.g., doped polysilicon) spacers. The spacers may be formed along the sidewall of the gate caps. Additionally, the active devices may have a two-step gate oxide, wherein a lower portion of the gate oxide has a thickness $T_2$ that is larger than the thickness $T_1$ of an upper portion of the gate oxide. The two-step gate oxide combined with the self-aligned source/body contacts allow for a highly scalable device that is capable of being produced with an active device pitch in the deep sub-micron level, e.g., 0.5-0.6 microns.

Additional aspects of the present disclosure describe a similar device that does not have a source region formed in the silicon epi part of the device. According to this aspect of the present disclosure, the semiconductor spacers, e.g., $N^+$-doped polysilicon spacers, may also serve as the source region, and therefore the addition of a source region within the substrate may be omitted. Additional aspects of the present disclosure describe a similar device where the source region formed in the silicon epi part of the device is formed by diffusing dopants from the doped polysilicon spacers into the silicon epi part of the device.

Additional aspects of the present disclosure describe a high density trench-based power MOSFET with self-aligned source contacts that is adapted for high switching speeds. In addition to the self-aligned source contacts and two-step gate oxide, the fast switching MOSFET further comprises a lightly doped P-region below the body region. The lightly doped P-region reduces the coupling between the gate and the drain of the device.

The two step gate oxide allows for a significant portion of the voltage to be supported by a lower portion of the gate oxide 374. This reduces the amount of voltage that the epitaxial layer 307 must support. FIG. 2A is a cross sectional view of an active device that displays the strength of the electric field, where darker shading indicates a higher electric field strength. As shown by the heavy shading along the bottom portion of the trench, the lower portion of the gate oxide 374 supports a large portion of the electric field. FIG. 2B is a graph depicting voltage that has been blocked by device 300 versus the depth into the substrate. Device 300 begins blocking voltage at a depth of approximately 0.5 microns. This depth is consistent with the depth at which the lower portion of the gate oxide 374 with a thickness $T_2$ begins. Near the bottom of the trench and the oxide 374 (about 1.0 microns) the device has blocked a total of approximately 18 volts. This greatly reduces the voltage blocking burden of the epitaxial layer 307. Therefore, the doping concentration of epitaxial drift layer 307 may be increased in order to reduce the $R_{dsA}$ of device. The increase in the doping concentration of the epitaxial layer 307 along with lower channel resistance due to smaller cell pitch allows for an approximately 90% or more decrease in the $R_{dsA}$ when compared to the prior art trench based MOSFET designed to support the same voltage described in FIG. 1A, or an approximately 37% or more decrease in the $R_{dsA}$ when compared to the prior art split gate MOSFET designed to support the same voltage described in FIG. 1B.

The $R_{dsA}$ of the device is further decreased because of the location of the accumulation region 391. As shown in FIG. 2C, when the gate is turned on a narrow accumulation region 391 is formed in the upper portion of the epitaxial layer 307 adjacent to the trench sidewall. By way of example, the accumulation region 391 may be approximately 300-400 Å wide. This concentration of charge carriers along the accumulation region reduces the resistance over the upper portion of the epitaxial layer 307. Further, since the accumulation region 391 is thin, reducing the cell pitch does not affect the resistance as long as the pitch is greater than the width of the accumulation region 391. This feature is not present in a split gate MOSFET device of the type described above with respect to FIG. 1B. In that type of device, the lower portion of the trench is kept at the source potential, which prevents an accumulation region 391 from forming along a narrow path proximate to the sidewall. Therefore, it is not practical to shrink the pitch of the split gate MOSFET to the deep sub-micron level.

FIG. 3A is a cross sectional view of a device structure 300 according to aspects of the present disclosure. The device structure 300 may be built on a semiconductor substrate 301. The substrate 301 may be suitably doped to be an N-type or a P-type substrate. As used herein, the substrate 301 will be described as an N-type substrate. The semiconductor substrate 301 may comprise a heavily doped $N^+$ drain region 302 and an epitaxial layer 307. By way of example, the drain region 302 may have a doping concentration of approximately $10^{19}$ cm$^{-3}$ or greater. The epitaxial layer 307 may be grown above the drain region 302 and may be lightly doped with N-type dopants. By way of example, the epitaxial layer 107 may have a doping concentration that is approximately between $10^{15}$ cm$^{-3}$ and $10^{17}$ cm$^{-3}$. A suitably doped P-body layer 303 may be formed in a top portion of the epitaxial layer 307. An N+-doped source region 304 may be formed in a top portion of the body layer 303.

According to aspects of the present disclosure, the active area of the device structure 300 may comprise a plurality of trench based power MOSFETs. The trench based power MOSFETs are formed by creating a trench 370 that extends through the P-body region 303 and into the epitaxial layer 307. Each trench may have an upper portion 371 and a lower portion 372. The upper portion of the trench 371 may be lined with an upper insulative layer 373 that has a thickness $T_1$, and the lower portion of the trench 372 may be lined with a lower insulative layer 374 that has a thickness $T_2$. According to aspects of the present disclosure, it is desirable that the thickness $T_1$ be smaller than the thickness $T_2$. By way of example, the upper and lower insulative layers may be an oxide. The remainder of the trench may be filled with a suitable material to form a gate electrode 309. By way of example, the gate electrode 309 may be formed with polysilicon. Though not shown in FIG. 3A, gate electrodes 309 are connected to a gate pad and are maintained at a gate potential. Each gate electrodes 309 is electrically isolated from a source material 317 by an insulative gate cap 308 which is disposed above the trench. An insulative layer 355 may also be formed above the source region 304. The possibility of short circuiting the gate electrode 309 to the source material 317 may be reduced by forming an insulative spacer 341 along the vertical edges of the gate caps 308. By way of example, the insulative spacer 341 may be an oxide.

The source regions 304 are electrically connected to the source material 317 through self-aligned contact openings 389 in the substrate that extend through the insulating layer 355 and the source region 304. The openings 389 are self-aligned by the N+-doped polysilicon spacers 342 formed along the exposed sidewall of the insulative spacers 341. These spacers function as a mask layer for an etching process used to form the contact openings 389. The N+-doped polysilicon spacers 342 reduce the contact resistance by increasing the area of contact to the source and allow for the formation of an ohmic contact. By way of example and not by way of limitation, the electrical connections may be made with conductive plugs 357. By way of example and not by way of limitation, the conductive plugs 357 may be made from a conductive material such as tungsten. An ohmic contact between the conductive plugs 357 and the P-body layer 303 may be improved by the addition of an ohmic contact region 343. The ohmic contact region 343 is a highly doped P-region that is formed on the exposed surface of the self-aligned contact openings 389. By way of example, the ohmic contact region 343 may by formed by implanting P-type dopants such as boron with a doping concentration of approximately $1 \times 10^{19}$ cm$^{-3}$.

The self-aligned contact openings 389 may be formed sufficiently close to each other such that the active devices in the MOSFET device have a pitch P of less than 1.0 microns. More specifically, aspects of the present disclosure allow for the devices to have a pitch P of less than 0.6 microns. This pitch is made possible in because the self-alignment of the contact openings 389 eliminates alignment errors even when the devices are scaled to have a pitch below 1.0 micron. This ensures that threshold voltage of the device is maintained, because the dopants from the ohmic contact region 343 remain outside of the channel. Additionally, the self-alignment of the contact openings 389 allows for precise control of the parasitic BJT turn on because the distance between the trench sidewall and the conductive plug will be substantially constant across the device. Consistent spacing makes the resistance of the body region and the voltage drop across the body region substantially constant across the device as well. Therefore, there will be little variation in the conditions that will cause the parasitic BJT to turn on for each active device.

Figure 3B:
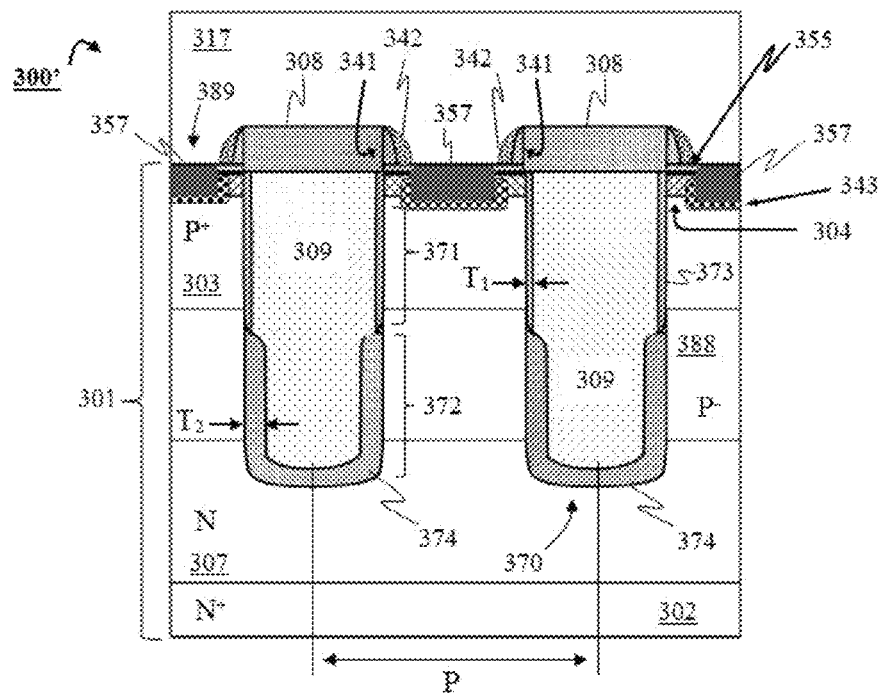

According to another additional aspect of the present disclosure, a device structure 300' may also be configured for fast switching applications such as DC-DC applications. FIG. 3B depicts a structure 300' that is substantially similar to device 300 in FIG. 3A, but with the addition of a sub-body layer 388. The sub-body layer 388 is a lightly doped P-layer formed below the P-body layer 303 and electrically connected to the source metal. The dopant concentration of the sub-body layer 388 should be low enough to allow for an inversion channel to be formed proximate to the lower insulative layer 374. The doping range for the lightly doped sub-body layer 388 may be from about $1 \times 10^{14}$ cm$^{-3}$ to about $1 \times 10^{16}$ cm$^{-3}$ Adding the sub-body layer 388 to device 300' reduces the coupling between the gate electrode and the drain electrode, and therefore provides significant decreases in the values of $Q_g$, $Q_{gd}$, and $Q_{OSS}$. Further the $R_{ds-on}$ of the device is only slightly increased. As described above these variables are included in the key figures of merit for determining the switching speed of a device. By maximizing $Q_g$, $Q_{gd}$, and $Q_{OSS}$ with only a slight increase in $R_{ds-on}$, the switching speed of device 300' may be greatly improved. The sub-body layer 388 may extend to a depth below the top portion of the trench 371. As the depth of the sub-body layer 388 increases the improvements in the switching speed increase as well. However, the increase in depth also increases the $R_{ds-on}$.

Figure 3C:
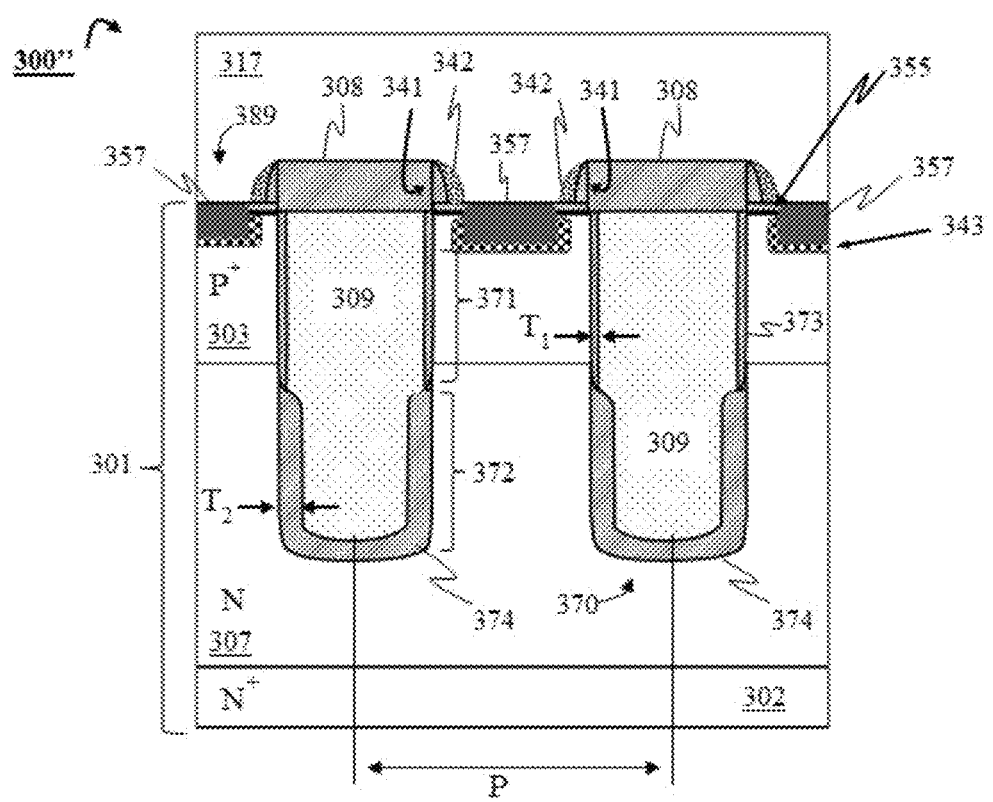

FIG. 3C depicts a device 300" according to an additional aspect of the present disclosure that omits the source region 304 from the top portion of the semiconductor substrate 301. Other than the removal of source region 304, device 300" is substantially similar to that of device 300 described in FIG. 3A. The source region 304 may be omitted because the N+-doped polysilicon spacer 342 may also serve as the source region due to its high concentration of N-type dopants. The utilization of the N+-doped polysilicon spacers 342 as the source region allows for the reduction of a source implantation step during processing, and significantly suppress the parasitic bipolar action.

Figure 3D:
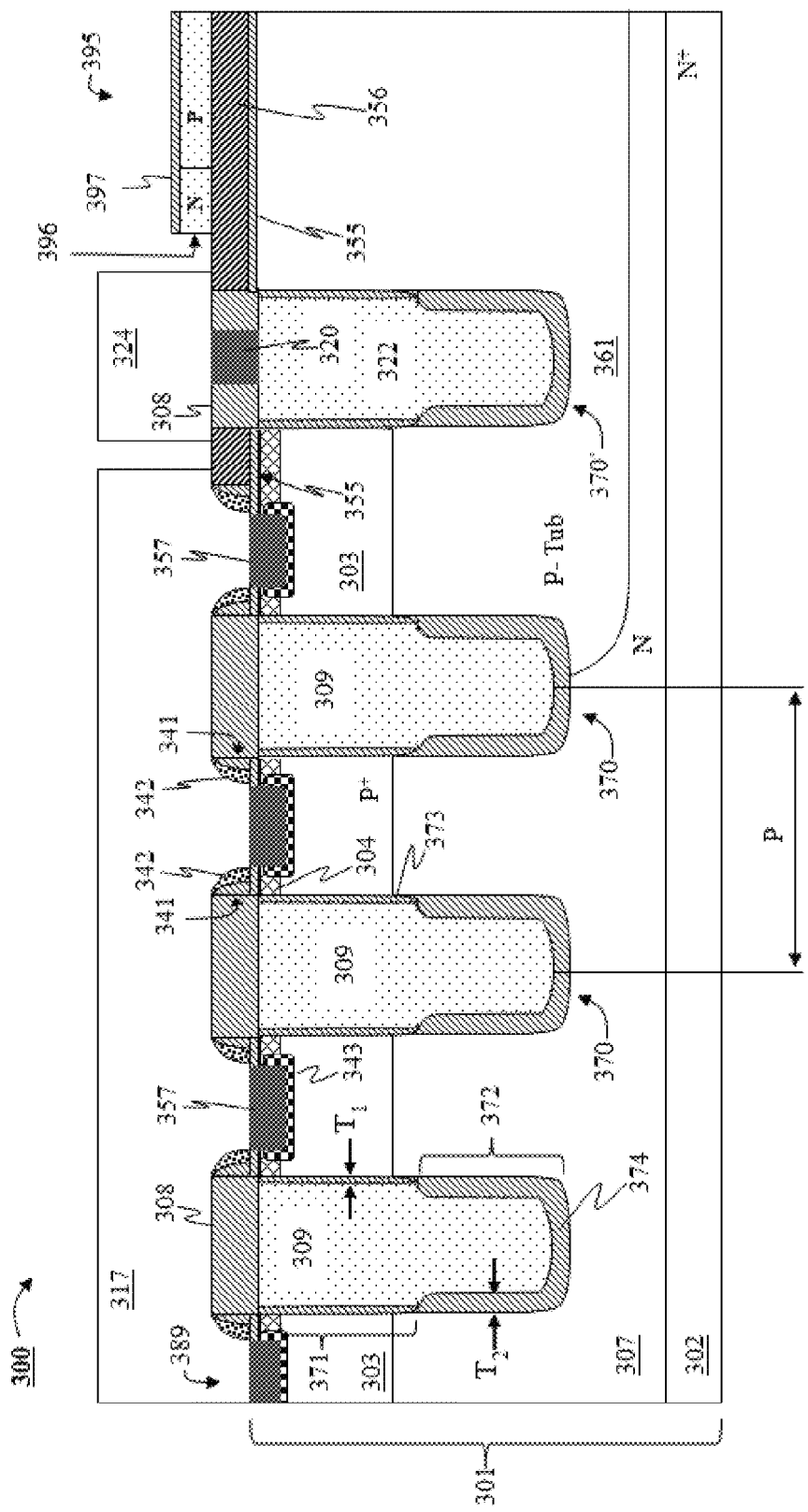

Device 300 may optionally include an electrostatic discharge (ESD) protection structure 395 as shown in FIG. 3D. The ESD protection structure 395 may be a conductive material 396 formed over a first layer 356 of a two layer hardmask. The conductive material 396 may be selectively doped to include N-type and P-type regions. An insulative layer 397 may be formed over a top surface of the conductive material 396.

Figure 3E:
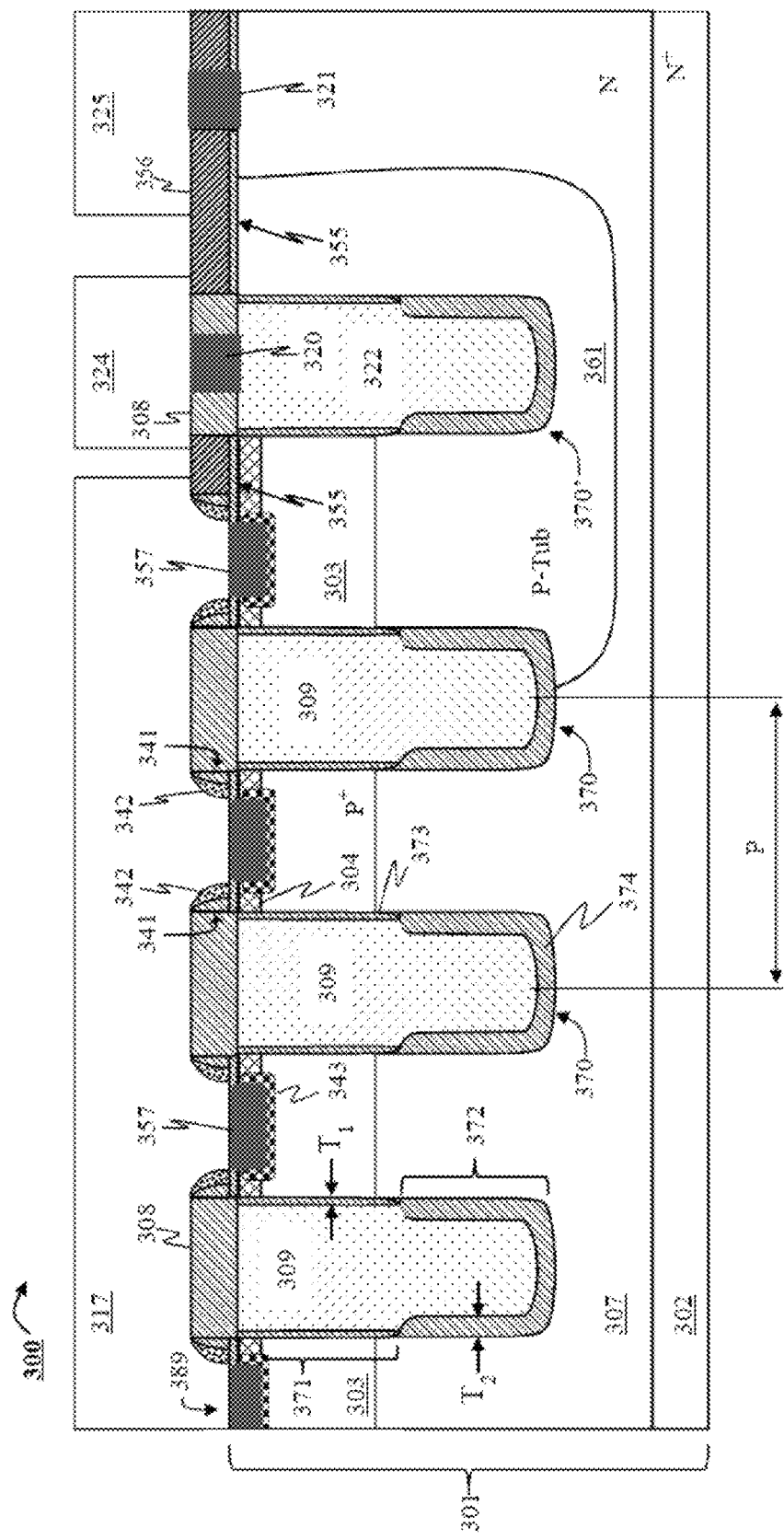

Device 300 may also optionally include one or more gate pickup trenches 370' as shown in FIG. 3D. The gate pickup trench 370' is substantially similar to the active device trenches 370. However, instead of an electrically insulated gate electrode 309, the gate pickup electrode 322 is electrically connected to a gate metal 324 with an electrical connection 320 that extends through the gate cap 308. By way of example, and not by way of limitation, the electrical connection 320 may be tungsten. The gate pickup trench may be formed in a deep doped region 361 that is doped with opposite-type dopants to the substrate 301. By way of example, and not by way of limitation, if the substrate 301 is N-type, the deep doped region 361 would be doped P-type, in which case it is sometimes referred to as a "P-Tub". Alternatively, if the substrate 301 us P-type, the deep doped region 361 would be doped N-type, in which case it is sometimes referred to as an "N-Tub". FIG. 3E depicts a device 300 that may also optionally include one or more Schottky contacts configured to terminate the electric field. The Schottky contacts in combination with the P-tub 361 may also function as a body clamp (BCL) configured to prevent the active devices from operating above their breakdown voltages. As shown in FIG. 3E, a metal contact 321 may electrically connect a Schottky metal 325 to the semiconductor substrate 301. By way of example, the contact 321 may extend through a hardmask having a first layer 356 and a second layer 355. By way of example, and not by way of limitation, the first layer may be a nitride layer and the second layer may be an oxide layer. By way of example, and not by way of limitation, the metal contacts 321 may be tungsten. The Schottky metal 325 may be deposited over the metal contacts 321 and the first layer of the hardmask 356 and is isolated from the gate metal 324. Additionally, the gate pickup metal 324 and the Schottky contact 325 are electrically isolated from each other.

Figure 4:
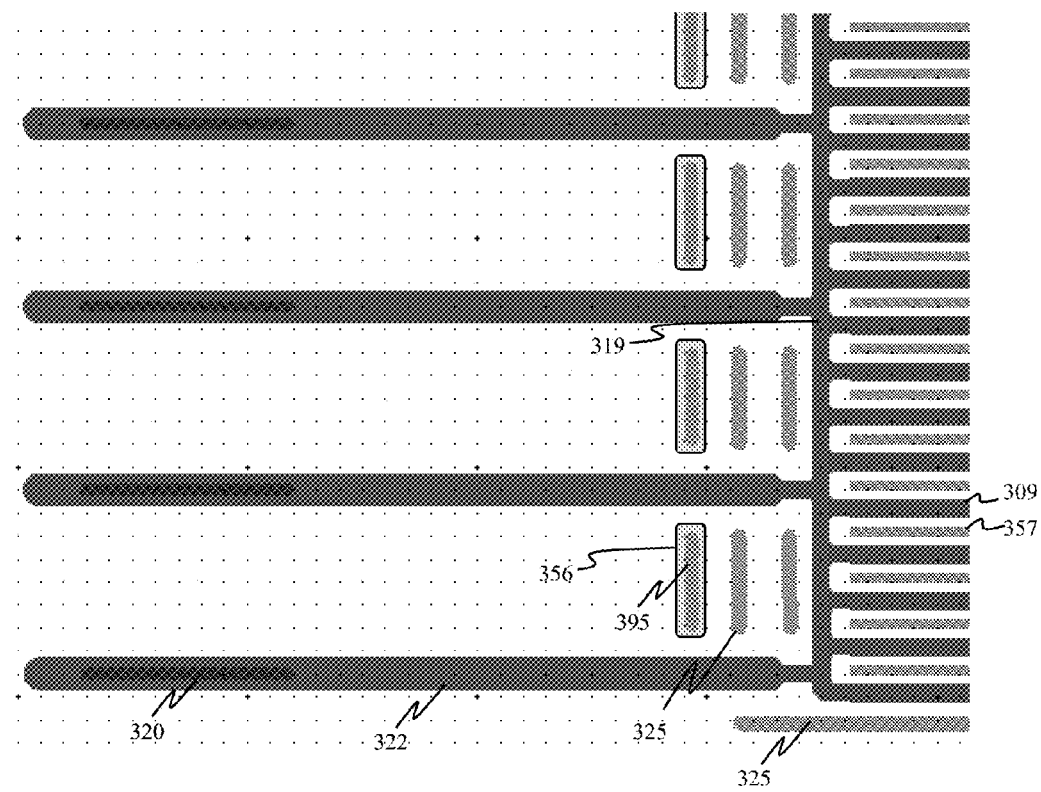
FIG. 4 is an overhead layout pattern of a MOSFET device according to aspects of the present disclosure.

FIG. 4 is a diagram of the layout for a device structure 300. The layout shows the gate electrodes 309 alternating with source contacts 357 in a device region. The source contacts 357 extend perpendicular to the plane of the drawing to make electrical contact with the source metal 317. Gate runners 319 electrically connect to the gate electrodes 309 to gate pickups 322. The gate electrodes, gate runners and gate pickups may be made from the same material, e.g., polysilicon, which may be formed in corresponding trenches in a common step. Gate contacts 320 extend perpendicular to the plane of the drawing to make electrical contact with the gate metal 324 (not shown). The gate metal 324 may be initially formed as part of the same metal layer as the source metal 317. The gate metal 324 may be electrically isolated from the source metal 317 and/or Schottky metal 325, e.g., by forming a common metal layer followed by subsequent masking, etching and dielectric fill processes, as are commonly done for this purpose.

The BCL regions may be placed outside the active device region, which can be seen from the locations of Schottky contacts 325 in FIG. 4. Additionally, ESD structures 395 may be formed outside of the active device region. The ESD structures 395 may be formed over an insulator layer 356. Although the ESD structures 395 are shown as being formed outside the active region, they may also be located outside the gate pickup area.

Aspects of the present disclosure describe methods for fabricating the devices descried in FIG. 3A-3E. Methods of fabrication are described in conjunction with FIGS. 5A-5J which depict cross sectional views of a device structure 500 at different stages of fabrication.

Figure 5A:
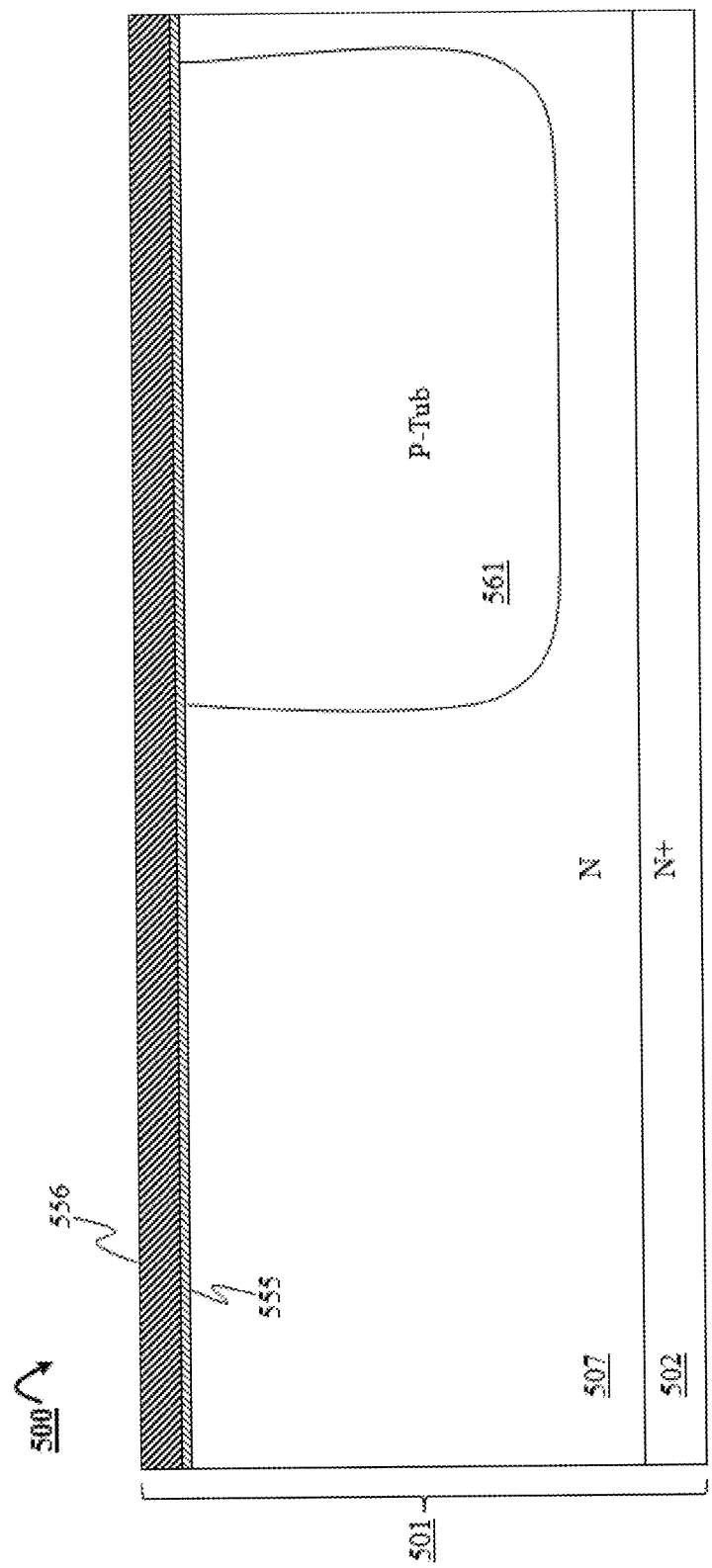
FIGS. 5A-5J are cross-sectional diagrams that describe a method for fabricating a MOSFET device according to aspects of the present disclosure.

FIG. 5A depicts a semiconductor region 501. The region 501 may be suitably doped to be an N-type or a P-type substrate. For purposes of illustration, the semiconductor region 501 used herein will be an N-type substrate. The semiconductor region 501 may comprise a heavily doped drain contact 502 with a lightly doped epitaxial region 507 grown above the drain contact region 502. A heavily doped P-tub 561 may be formed in the epitaxial layer 507. The P-tub may be formed by ion implantation or any other suitable method. By way of example, and not by way of limitation, a P-tub mask may be used with a masked implantation of P-type dopants.

A hard mask having a first insulating layer 556 and a second insulating layer 555 may be formed on a top surface of the semiconductor substrate 501. The second insulating layer 555 may be resistant to a first etching process that etches the first insulating layer 556, and the first insulating layer 556 may be resistant to a second etching process that etches the second insulating layer 555. By way of example, and not by way of limitation, the first insulating layer 556 may be a nitride layer and the second insulating layer may be an oxide. By way of example, the first insulating layer 556 may be between 0.2 microns (μm) and 0.5 μm thick, and the second insulating layer 555 may be between 50 angstroms (Å) and 250 Å thick.

Figure 5B:
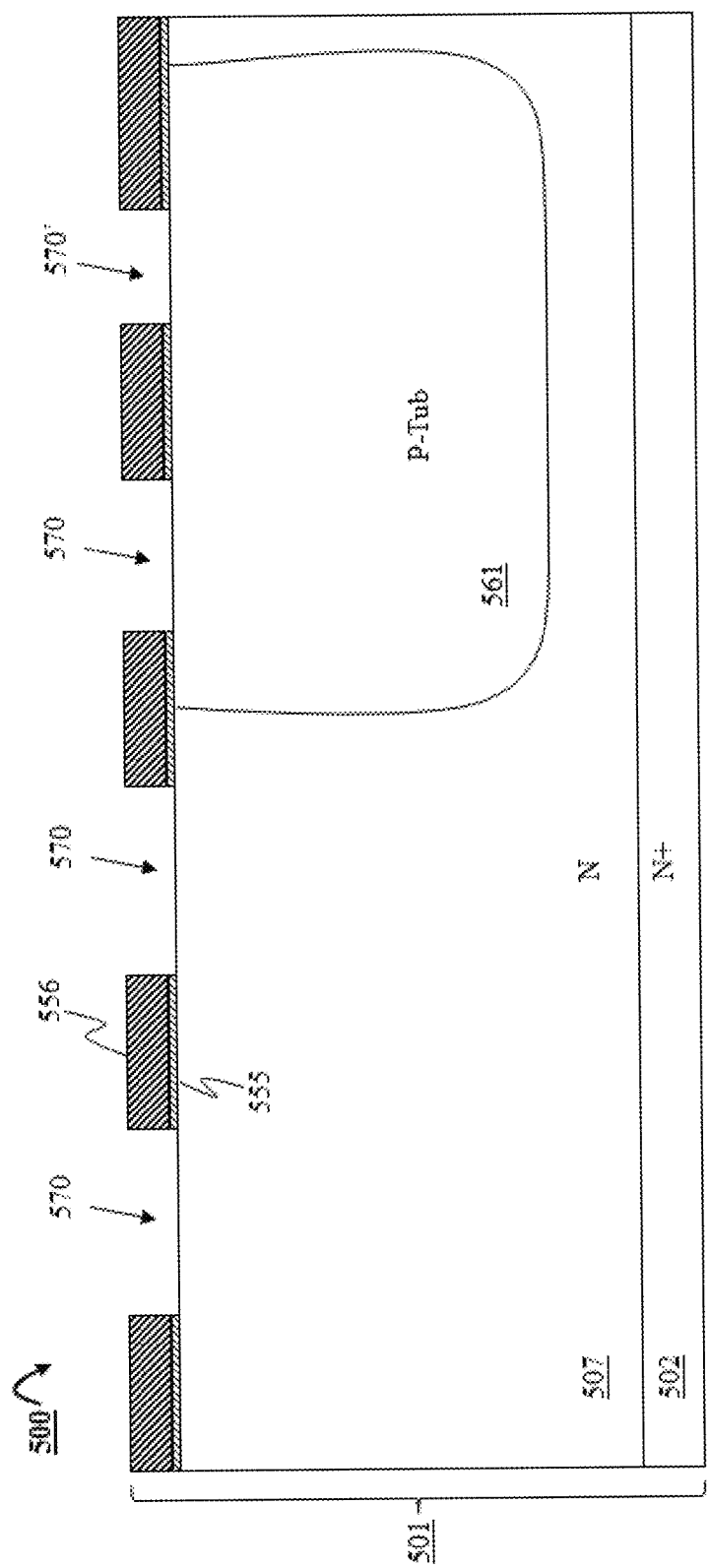
Figure 5C:
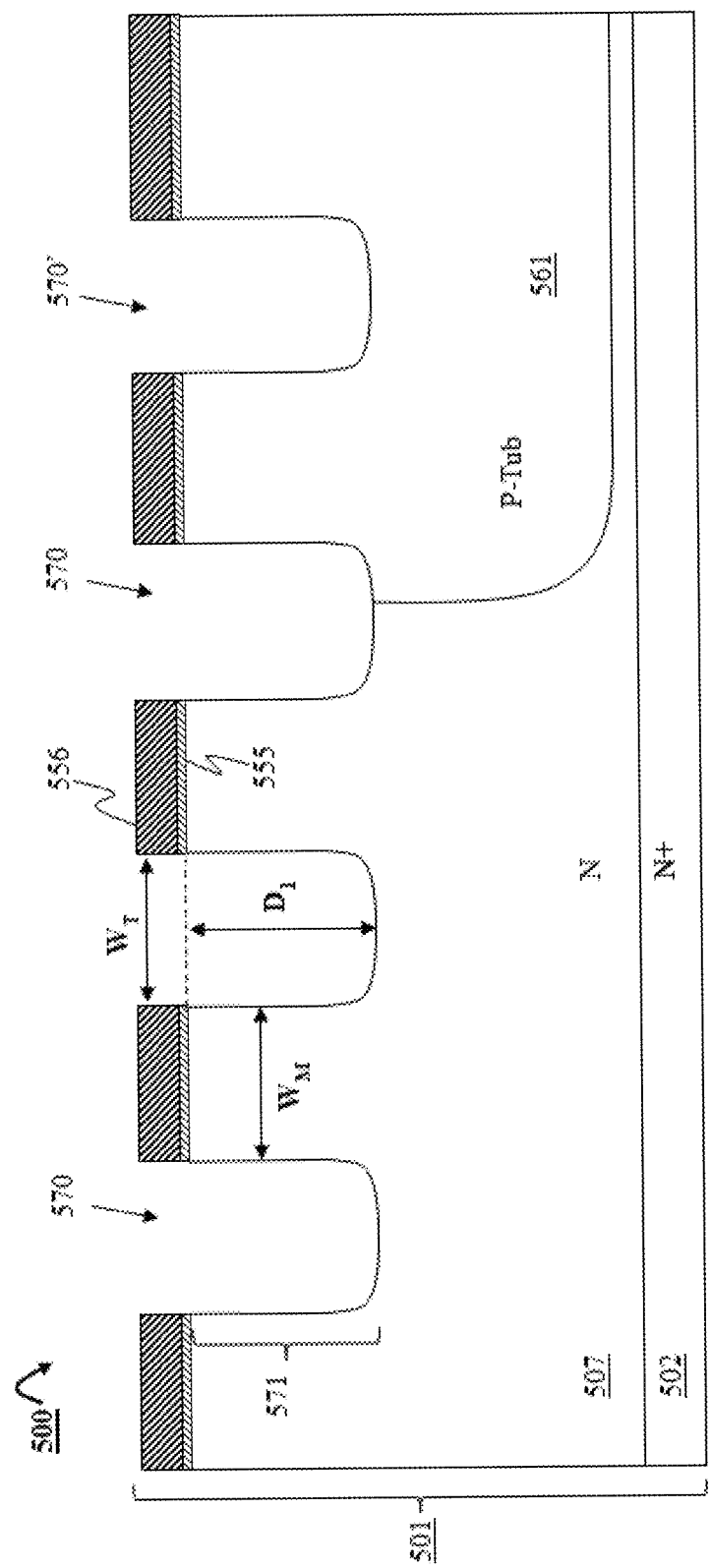

In FIG. 5B a trench mask may be utilized to define the locations of the trenches 570 by etching through the first and second insulative layers of the hardmask 556, 555. Additionally, the gate pickup trenches 570' may also be defined in the same processing step. Next, in FIG. 5C a partial trench etch is utilized to form the upper portion 571 of the trenches 570 and 570'. The upper portion of the trench 571 may be approximately half of the total depth of the trench 570. By way of example, and not by way of limitation, the depth of the upper portion of the trench $D_1$ may be approximately 0.5 μm deep. Each trench 570 may be spaced apart from other trenches by a mesa with a width $W_M$. By way of example the width $W_M$ may be between 0.2 μm and 0.5 μm. By way of example, the width of each trench $W_T$ may be between 0.2 μm and 0.5 μm.

Figure 5D:
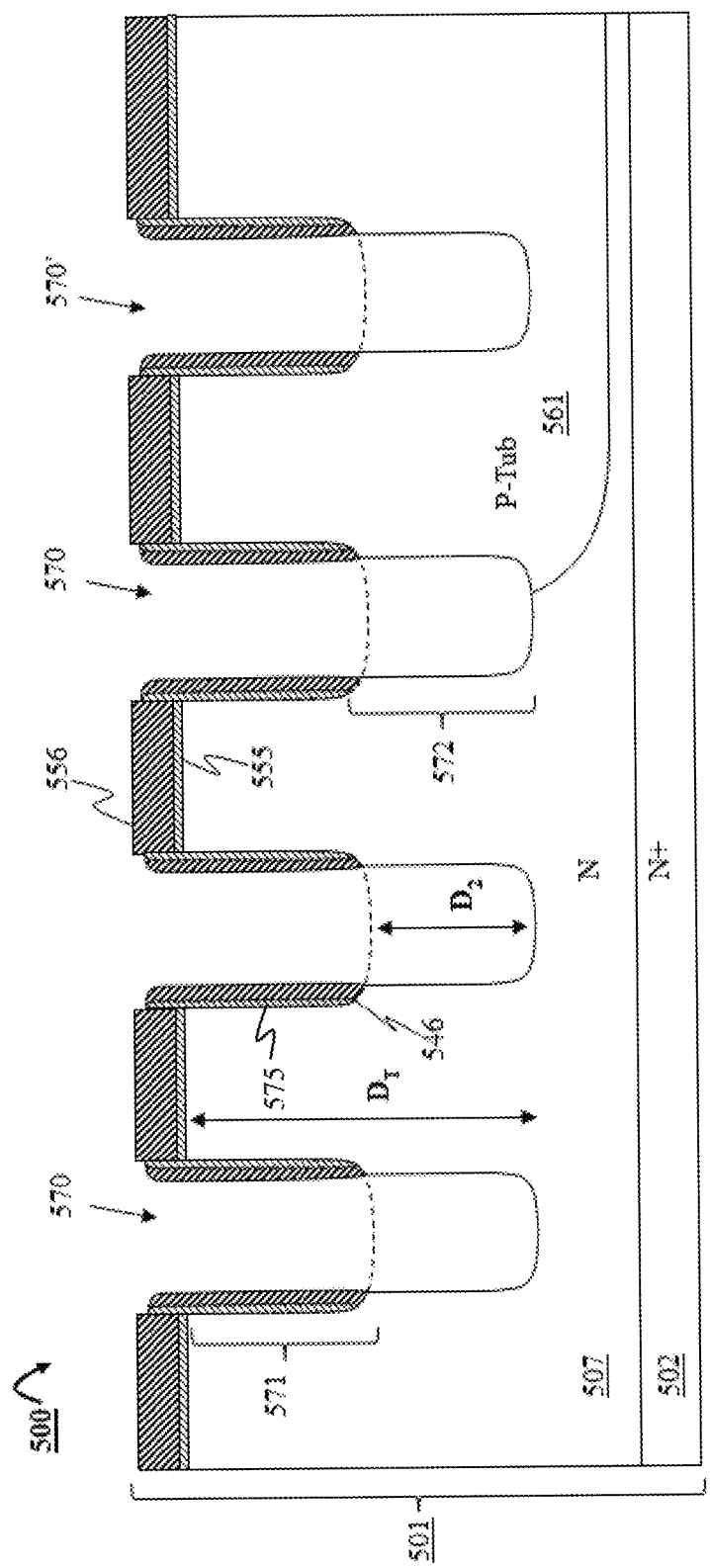

In FIG. 5D the upper portion of the trenches 571 are lined with a thin pad oxide 575 and an insulative spacer 546. The pad oxide 575 and the insulative spacer 546 prevent the upper portion of the trench 571 from growing an oxide during the processing of the lower portion of the trench 572. The insulative spacer 546 also functions as an additional mask layer in order to reduce the width of the lower portion of the trench 572. By way of example, the insulative spacer 546 may be a nitride. After the insulative spacer 546 has been formed, the lower portion of the trench 572 may be formed by an etching process. By way of example, and not by way of limitation, the depth of the second portion of the trench $D_2$ may be an additional 0.5 μm, resulting in a total depth $D_T$ of the trenches 570, 570' being approximately 1.0 μm.

Figure 5E:
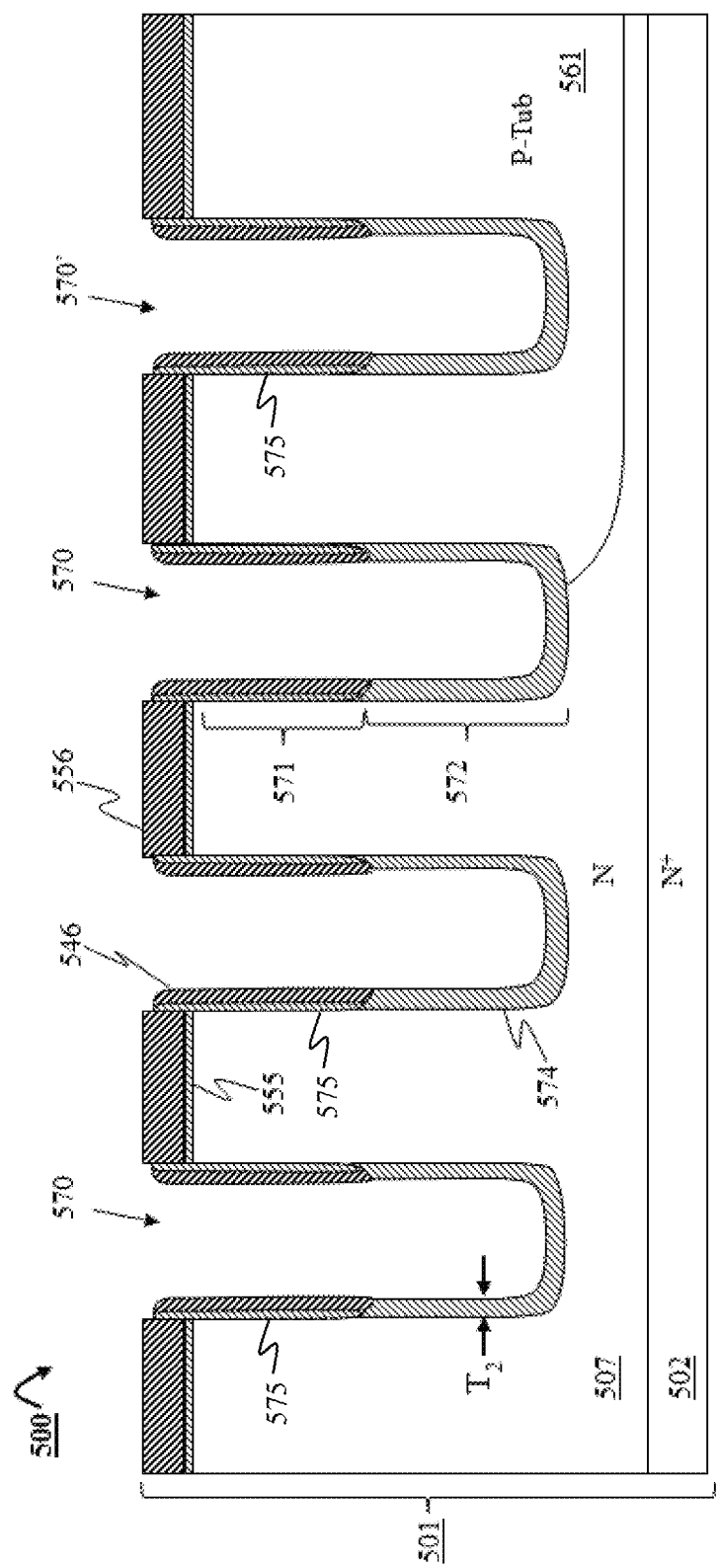
Figure 5F:
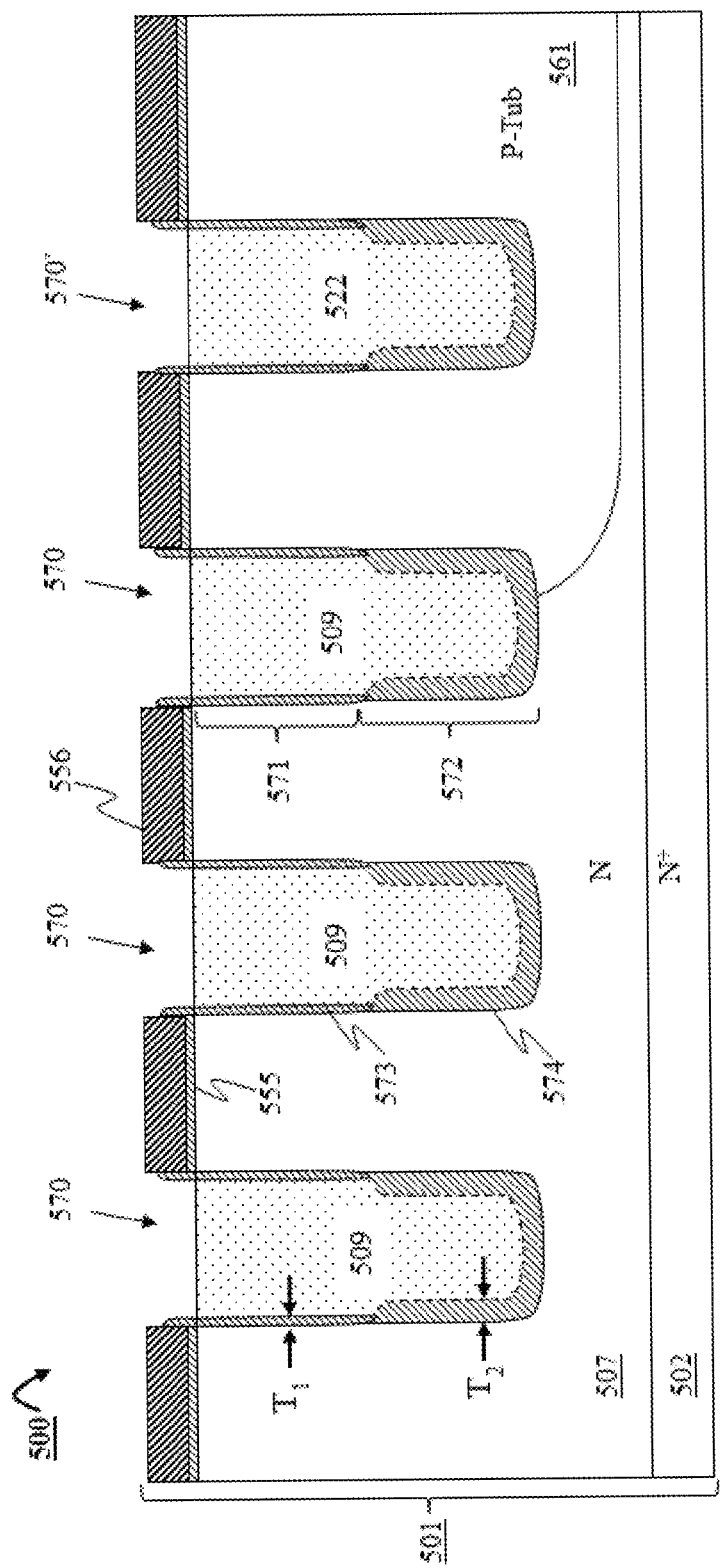

Next, in FIG. 5E a lower insulative layer 574 may be formed. By way of example, but not by way of limitation, the lower insulative layer 574 may be an oxide grown through thermal oxidation. Typically, the thickness $T_2$ may range from 400 Å-1500 Å. In FIG. 5F the pad oxide 575 and the insulative spacers 546 are removed first. Then, the upper insulative layer 573, which is a gate oxide, may be grown. The thickness $T_1$ may range from 50 Å-500 Å. While the ranges for the thicknesses for $T_1$ and $T_2$ slightly overlap, it is desirable for the thickness $T_2$ of the lower insulative portion 574 to be larger than the thickness $T_1$ of the upper insulative layer 573. After the upper insulative layer 573 is grown, the trenches 570 and 570' may be filled with a conductive material in order to form the gate electrode 509 in the active devices and the gate pickup electrode 522 in the gate pickup trench 570'. In order to minimize the possibility of forming voids within the electrodes 509 and 522 the trenches should have an aspect ratio of width to depth no greater than approximately 1:6. By way of example, and not by way of limitation, the conductive material used to form the electrodes 509 and 522 may be a polysilicon doped with N-type dopants. Once the trenches 570 and 570' are filled, the conductive material may be etched down in order to be substantially planar with the top surface of the semiconductor substrate 501.

Figure 5G:
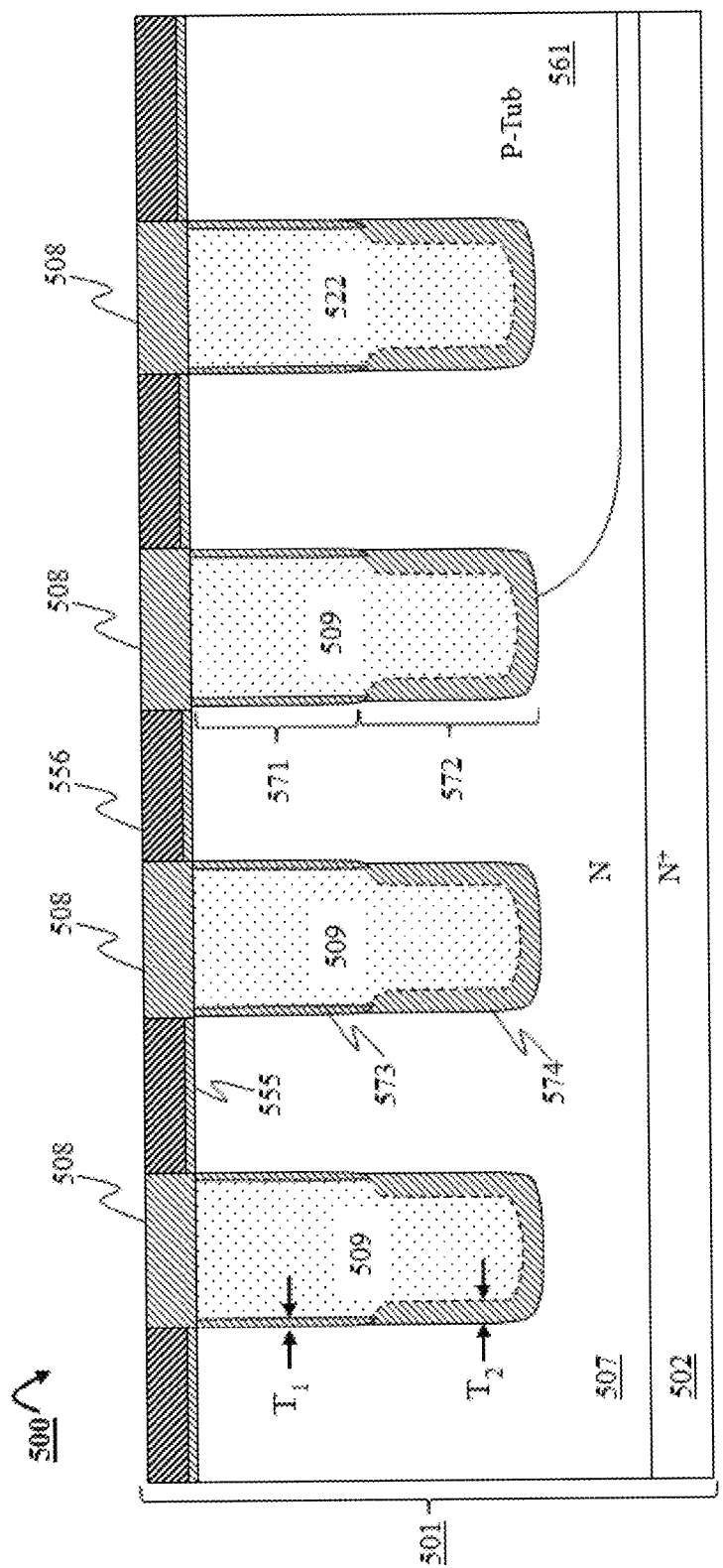

In FIG. 5G, the insulative gate caps 508 are formed. The insulative gate caps may be formed with a deposited oxide, such as but not limited to borophosphosilicate glass (BPSG) or tetraethylorthosilicate (TEOS). After the insulative gate caps 508 have been deposited, they may be planarized with the top surface of the first layer of the hardmask 556. By way of example, the planarization may be done with chemical mechanical planarization (CMP). By way of example, and not by way of limitation, the thickness of the gate caps 508 may be approximately 300 Å. Gate caps 508 are self-aligned due to the presence of the first and second layers of the hardmask 556 and 555 that were originally etched to form the trench masks. Without the need for an additional mask aligning step, the alignment of the gate caps 508 may be improved. Further, the self-alignment of gate caps 508 provides the foundation for the self-aligning source contacts. Therefore, it is critical that the gate caps 508 be properly aligned.

After the caps 508 have been formed, device 500 may have the first layer of the hardmask 556 removed in the active area with a masking and a first etching process. The first etching process may selectively remove the first layer of the hardmask 556 with little effect on the second layer of the hardmask 555. By way of example, if the first hardmask layer 556 is a nitride and the second hardmask layer 555 is an oxide, then a hot-phosphoric acid wet dip may preferentially remove the nitride while leaving the oxide. Once the first hardmask layer 556 has been removed, the P-body 503 may be implanted into a top portion of the semiconductor substrate 501. The $N^+$-source region 504 may also be implanted after the first layer of the hardmask 556 has been removed. Next, an insulative spacer 541 may be formed along the sidewalls of the gate caps 508 in order to prevent a short circuit between the gate electrodes 509 and the source metal 517. The insulative spacers 541 may be formed by depositing an insulation layer on the exposed surfaces of the device and then etching the insulation layer away with an anisotropic etch. The anisotropic etch will leave a portion of the insulative layer along the sidewalls of the gate caps 508 that will function as the insulative spacer 541 After the oxidization, a polysilicon layer may be disposed along the top surface of the second layer of the hardmask 555, over the exposed surfaces of the insulative spacer 541, and over the top surface of the gate caps 508. The polysilicon layer may be doped with a high concentration of N-type dopants. An anisotropic etch may then be used to remove the polysilicon layer, leaving behind only polysilicon spacers 542 spaced away from the sidewalls of the gate caps 508 by the insulative spacer 541. By way of example and not by way of limitation, the anisotropic etch process may be a reactive ion etching (RIE). The anisotropic etch process may also etch through the second layer of the hardmask 555. Additionally, the polysilicon spacers 542 may be used to form the source regions 504 with a diffusion process instead of the implantation step as described above. The source regions 504 may be formed by diffusing N-type dopants from the polysilicon spacer 542 into the top portion of the epitaxial layer 507 below the spacers 542.

With the top surface of the epitaxial layer 507 exposed, another anisotropic etching process may be used to etch through the epitaxial layer in order to expose the P-body region 503 with the self-aligned contact openings 547. The polysilicon spacers 542 protect the source region 504 underneath and therefore provide source regions 504 with a consistent size across the device 500. In order to provide better ohmic contact with the source metal 517, a high concentration of P-type dopants may be implanted into the surface of the self-aligned contact openings 547 in order to form ohmic contacts 543. By way of example, a boron surface implant may be used to form the ohmic contacts 543.

Figure 5H:
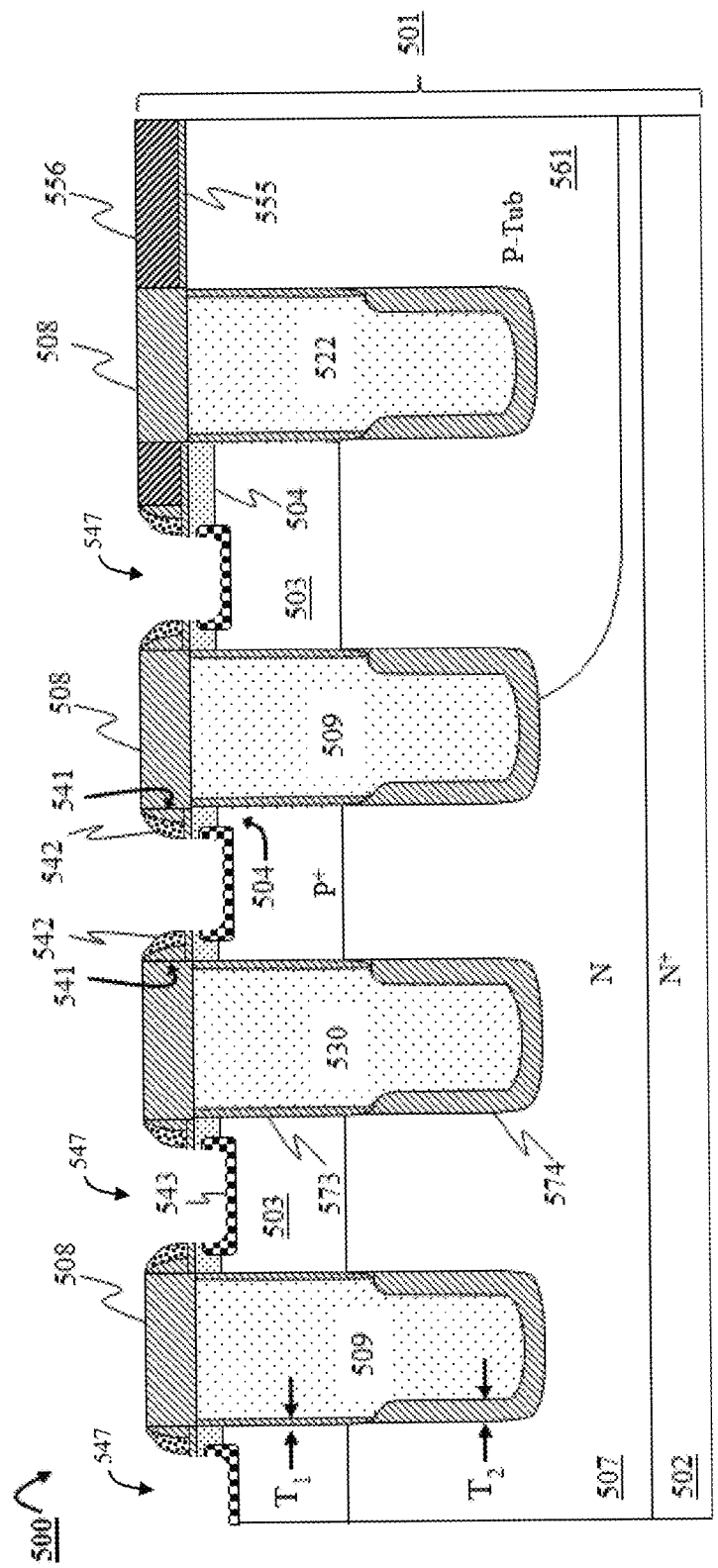
Figure 5H:
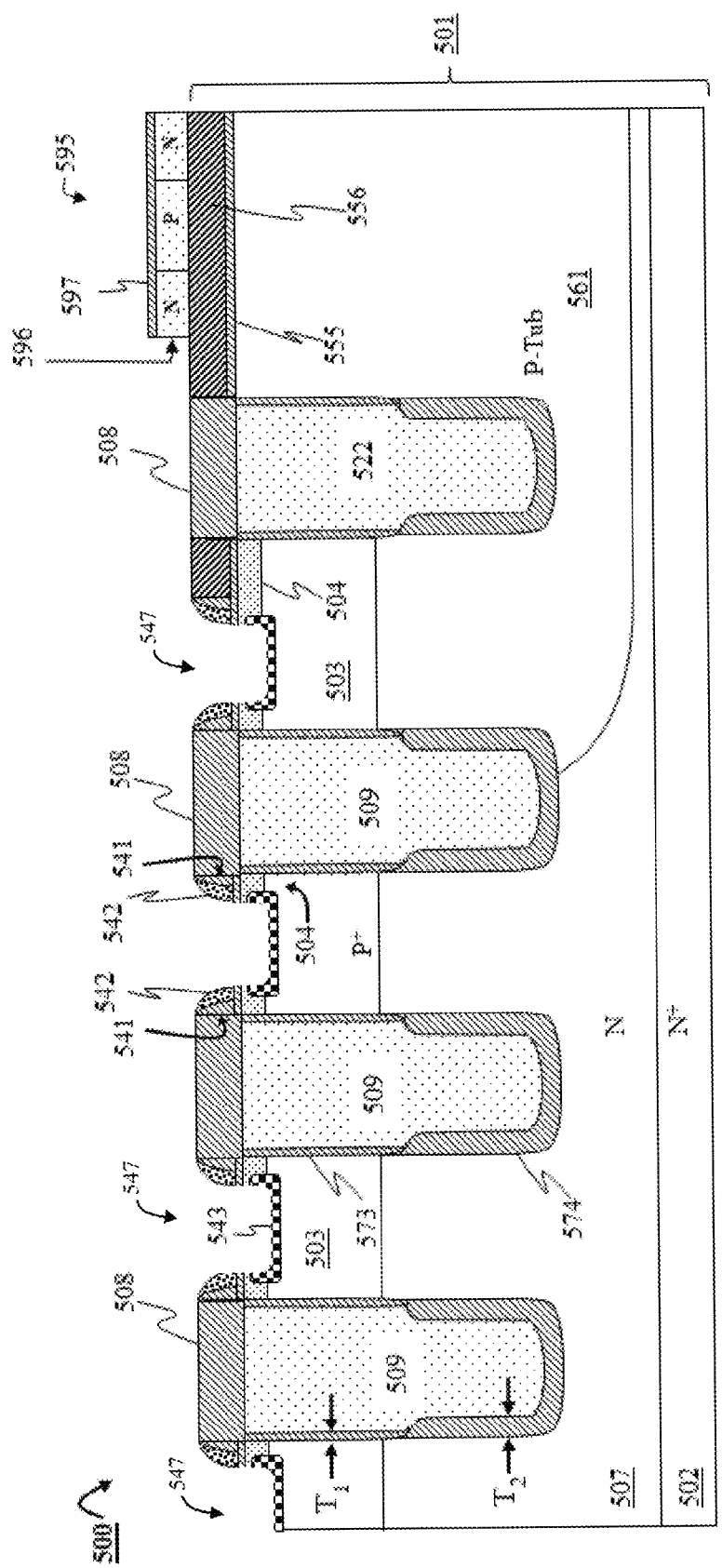

According to additional aspects of the present disclosure, the device 500 may also have an ESD structured 595. FIG. 5H' shows that the structure 595 may be formed before the first hardmask layer 556 is removed from the active region. By way of example, the ESD structure may be formed by first depositing an un-doped polysilicon layer over the top surface of the device 500. A first ESD mask may then be used to selectively dope, with N-type dopants, the regions of the polysilicon that will become the ESD diode 596. The P-type portions of the ESD diode 596 may be implanted during the P-body implant. A second ESD mask may then be used to selectively remove the polysilicon layer in order to form the ESD diode 596. An insulative layer 597 may be grown over the ESD diode 596 to protect it from subsequent processing. Thereafter, device 500 may be processed according to the process described by FIG. 5H.

Figure 6A:
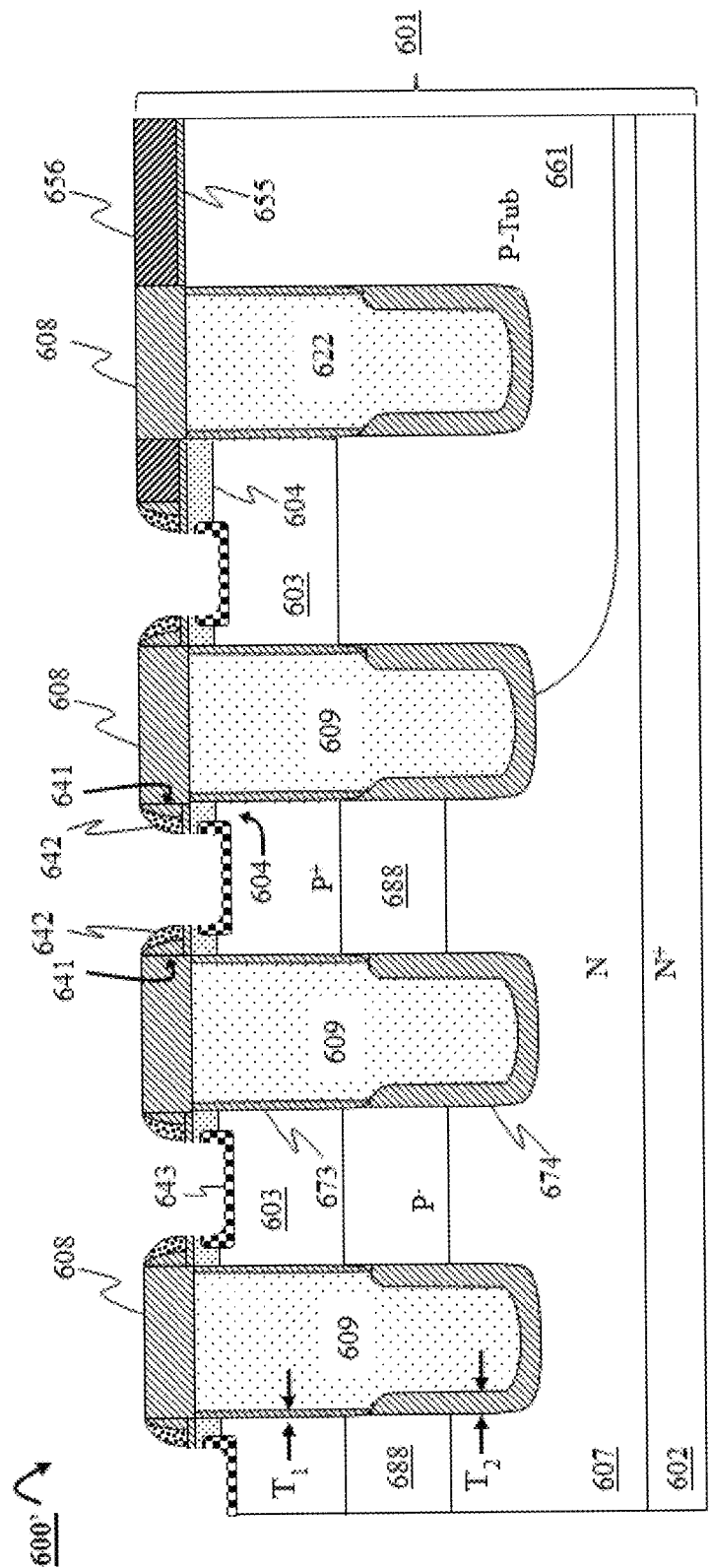
FIGS. 6A-6B are cross-sectional diagrams that describe alternate methods for fabricating a MOSFET device according to aspects of the present disclosure.

FIG. 6A describes the processing of a device 600' that is configured for fast switching speeds. The processing of device 600' is substantially similar to that of device 500 but with an additional step for forming a sub-body layer 688. The sub-body layer 688 may be formed by implanting a lightly doped P-region below the bottom surface of the body layer 603. This implantation may occur before or after the P-body layer 603 and/or the source regions 604 are implanted. Thereafter, the processing may continue according to the same processing as device 500.

Figure 6B:
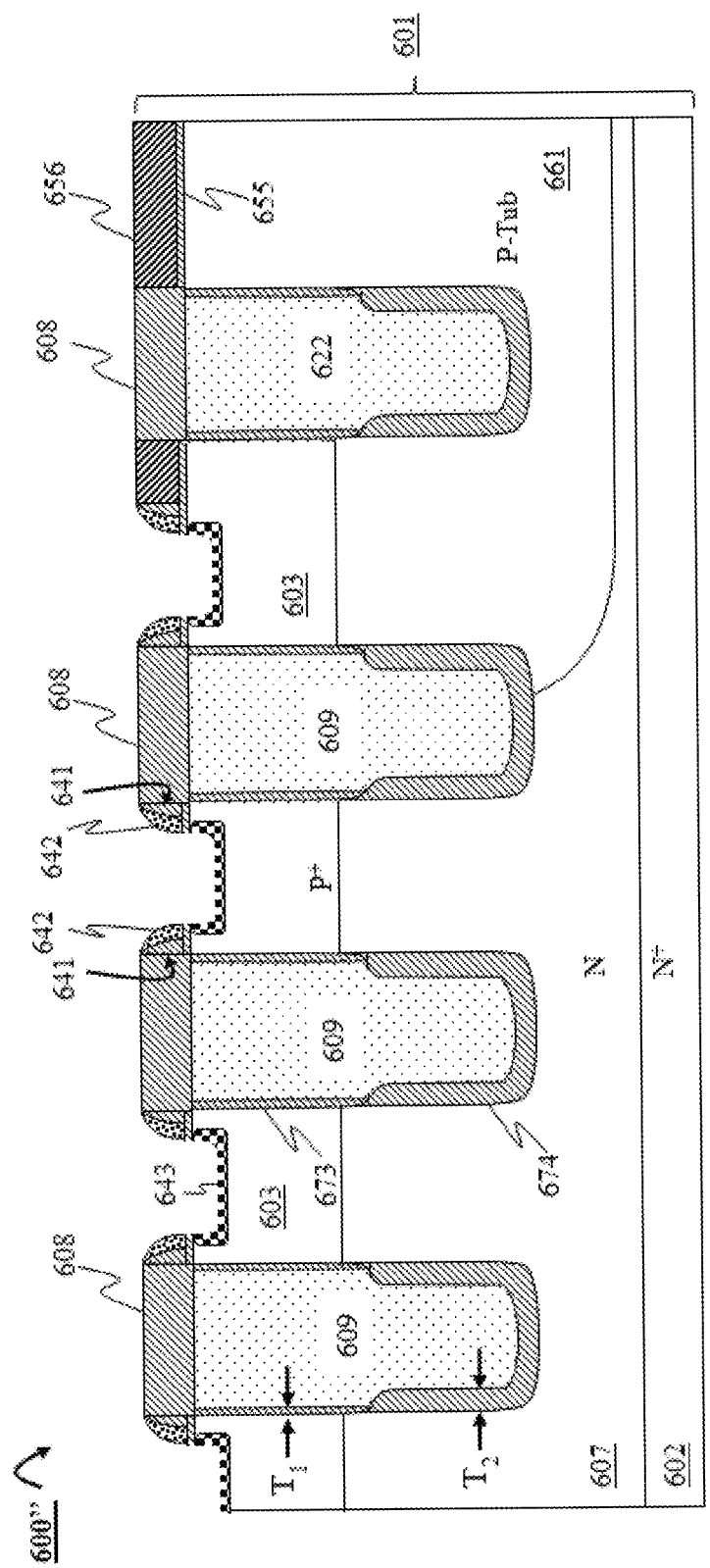

FIG. 6B describes the processing of a device 600". Device 600" is processed substantially the same as device 500, with the exception that there is no source region implanted into the semiconductor substrate 601. The device may still function because the polysilicon spacer 642 is doped with N-type dopants and may serve as the source region. Thereafter, the processing may continue according to the same processing as device 500.

Figure 5I:
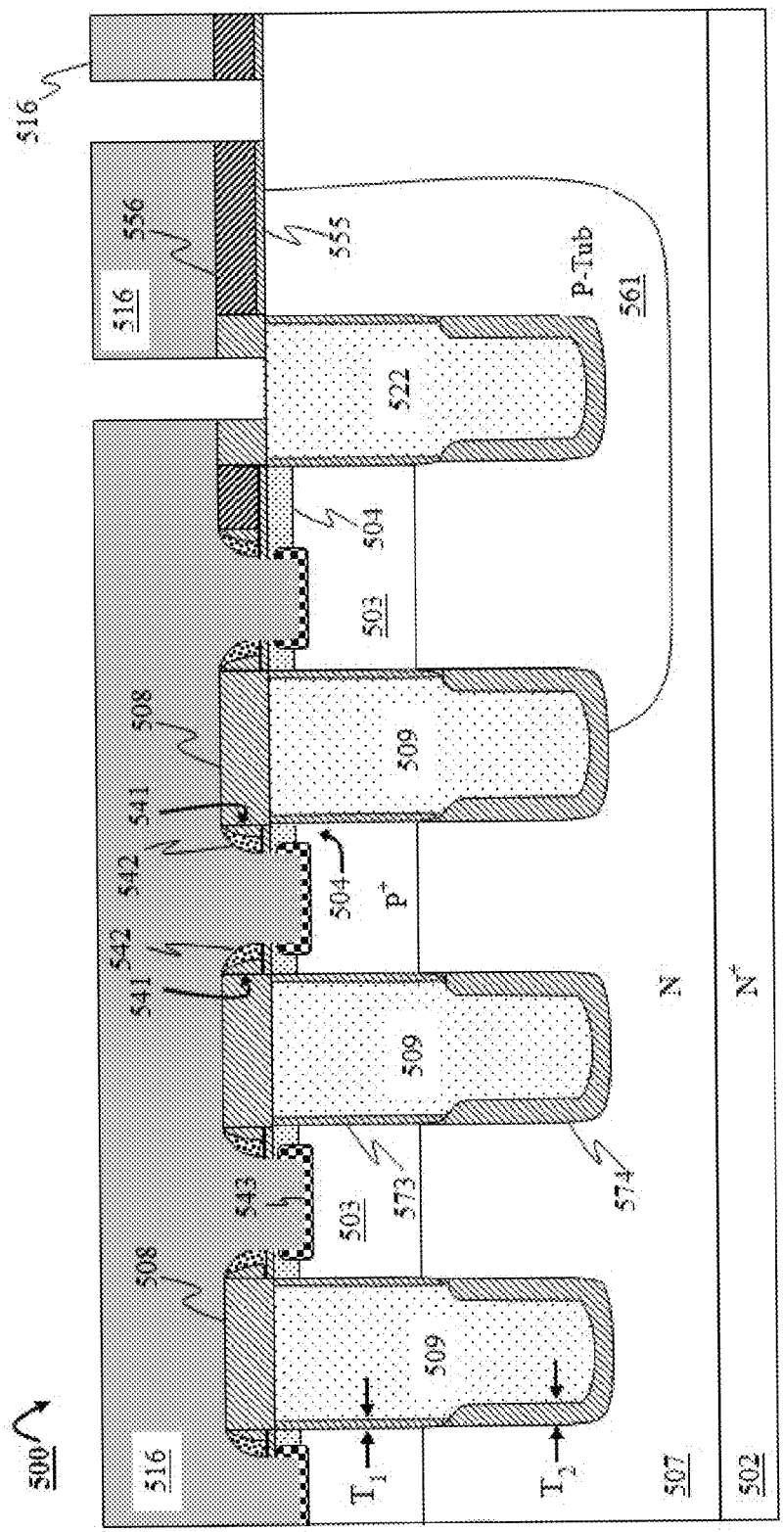
Figure 5J:
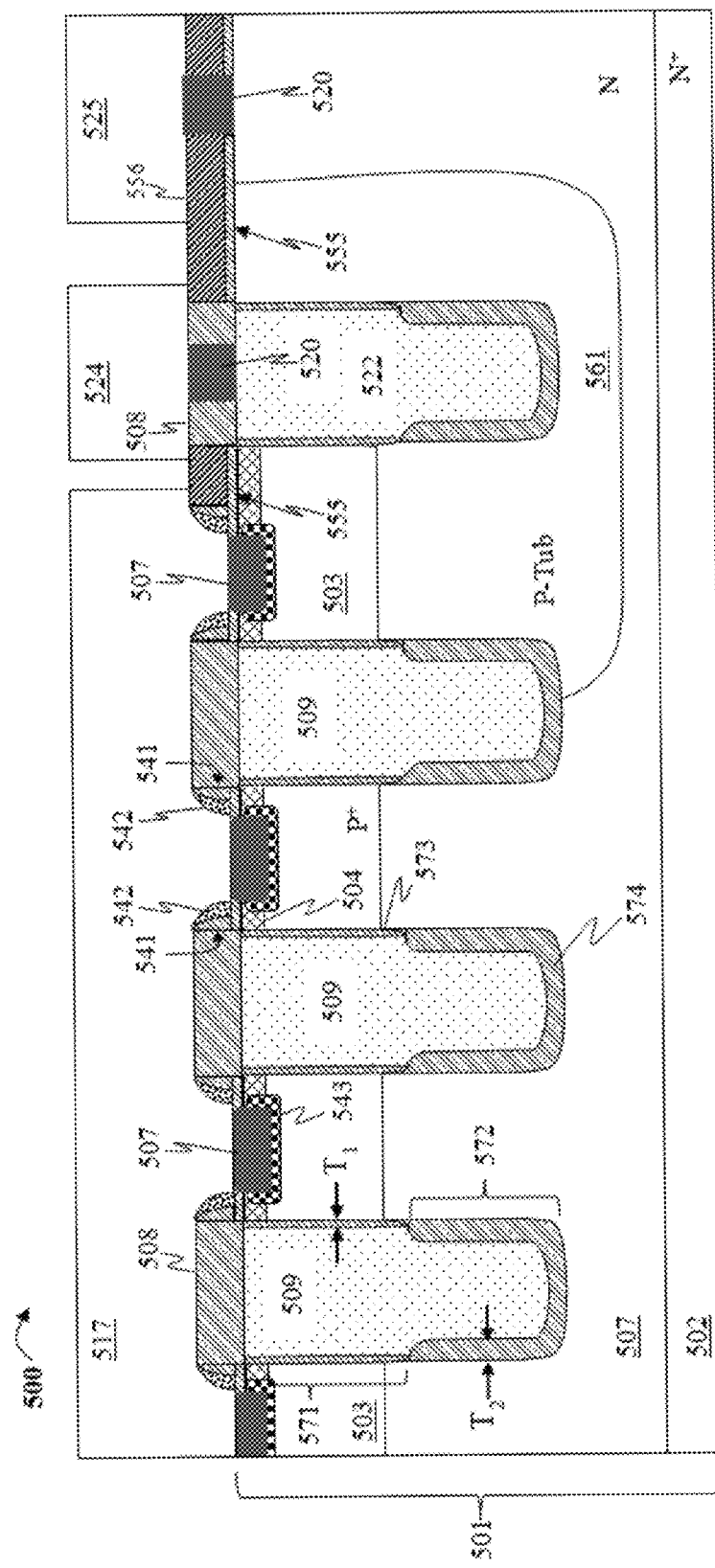

Returning to device 500, the processing continues with standard contact formation procedures. In FIG. 5I a photoresist layer 516 is deposited over the top surface of the device. A gate contact mask may be used to provide an opening through the gate cap over the gate pickup electrode 522. Additionally, the gate contact mask may provide an opening that allows for the first and second hardmask layers 556, 555 to be etched through in a non-active area of the device to form a Schottky contact 520. In FIG. 5J the photoresist layer is removed and the device 500 is prepared for metallization. Source contacts 507 may be formed in the self-aligned contact openings 547. By way of example, and not by way of limitation, the source contacts may be tungsten. Contacts 520 may also be made to connect the gate pickup electrode to a gate metal 524 and to connect the Schottky metal 525 to the substrate 501. By way of example, the contacts 520 may be made of tungsten. Finally a metal layer may be deposited over the top surface of the device. The metal layer may then be etched to form a source metal 517, a gate pickup metal 524 and a Schottky metal 525 connected to the source metal 517 with the use of a metal mask.

Figure 7A:
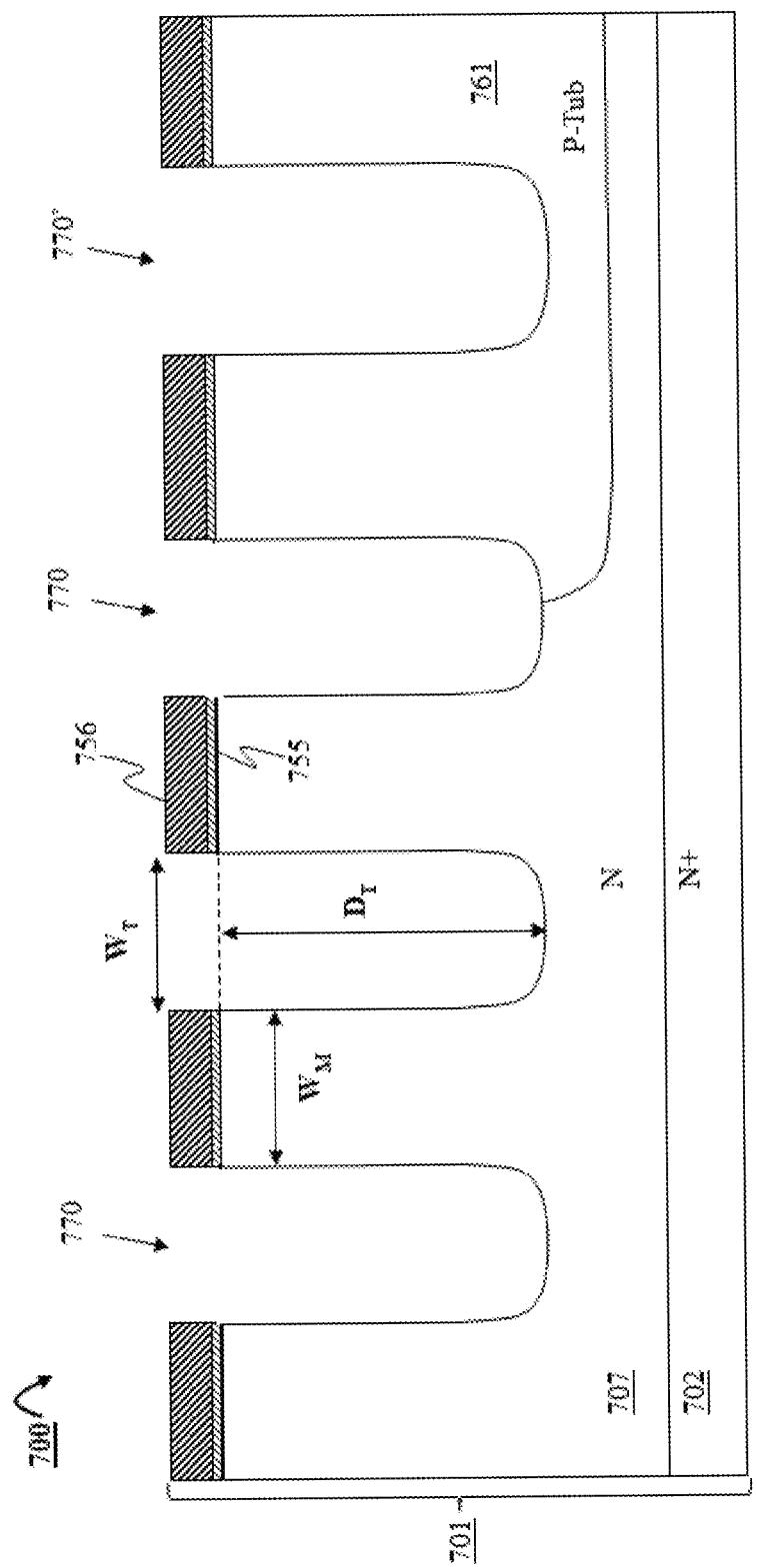
FIGS. 7A-7E are cross-sectional diagrams that describe an alternative method for forming the two step gate oxide of the MOSFET device according to aspects of the present disclosure.

Aspects of the present disclosure also describe an additional process for forming a two-step trench oxide layer. First in FIG. 7A an etching process is used to form trenches 770, 770' in the substrate 701 through a hard mask having a first insulating layer 756 and a second insulating layer 755 formed on a top surface of the semiconductor substrate 701. Substrate 701 may comprise a heavily doped $N^+$ drain region 702 and an epitaxial layer 707. Trenches 770 and trenches 770' are substantially similar. Trenches 770 may be used for active MOSFET structures, and be located in an active region of the device 700. Trenches 770' may be used for gate pickup structures and may be located in non-active regions of the device. As shown, trench 770' is formed in a P-tub 761. The trenches 770, 770' are formed to a depth $D_T$ and width $W_T$. By way of example, the depth $D_T$ may be approximately 1.0 micron and the width of the trench $W_T$ may be between approximately 0.2 μm and 0.5 μm. The trenches may be spaced apart from each other by a mesa that has a width $W_M$ ranging from approximately 0.2 μm-0.5 μm.

Figure 7B:
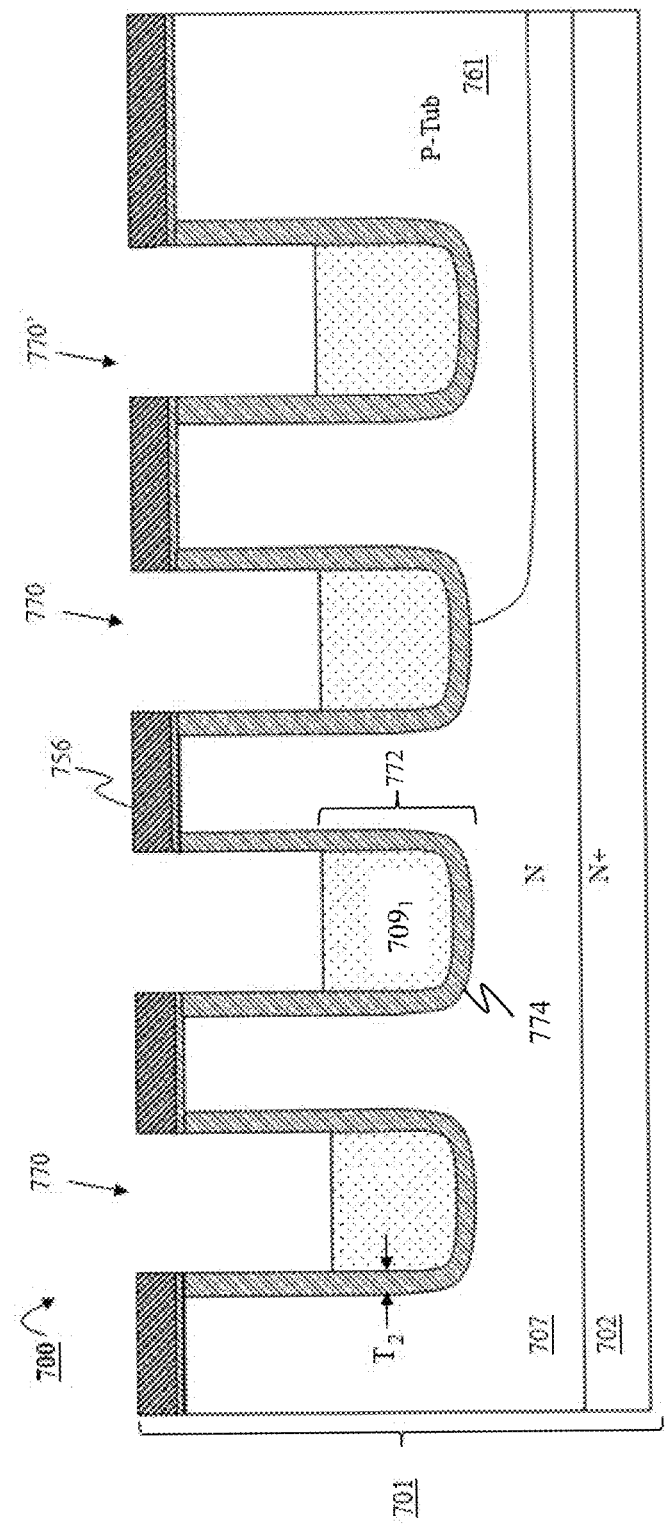

After the trenches 770, 770' have been made, an insulation layer 774 may be formed along the walls and the bottom surface of the trench, as shown in FIG. 7B. The insulation layer 774 may have a thickness $T_2$. By way of example, and not by way of limitation, the thickness $T_2$ may be between 400 Å and 1500 Å. Next the trenches 770, 770' may be filled with a first portion of the conductive material 709$_1$. The conductive material 709$_1$ may be etched back down such that it only fills the lower portion of the trench 772.

Figure 7C:
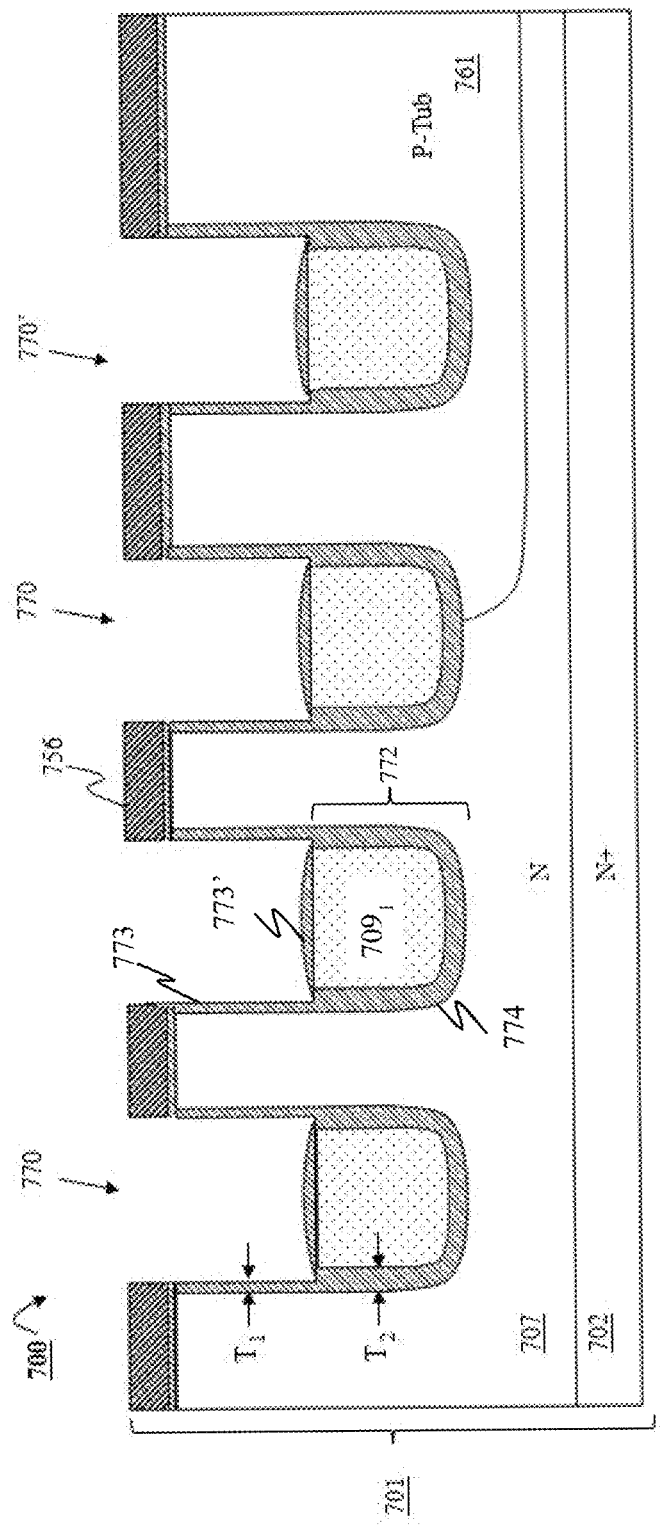

In FIG. 7C the insulation layer 774 in the upper portion of the trench 771 may be etched away. The insulation layer 774 in the lower portion of the trench 772 will be protected from the etching process by the first portion of the conductive material 709$_1$. Then the upper insulation layer 773 may be grown on the walls of the upper portion of the trench 771. The upper insulation layer 773 may have a thickness $T_1$. By way of example, and not by way of limitation, the thickness $T_1$ may be between approximately 50 Å and 500 Å. Further, it should be noted that even though the approximate ranges of the thicknesses $T_1$ and $T_2$ overlap, it is desirable that $T_2$ should remain larger than $T_1$. During the growth of the upper insulation layer 773, an insulation layer 773' may also form over the top surface of the first portion of the conductive material 709$_1$. A layer of insulation between portions of the conductive material 709 would cause the gate electrode to have a bottom portion that was not at the gate potential. However, simply etching away the unwanted insulation layer 773' may damage the upper insulation layer 773.

Figure 7D:
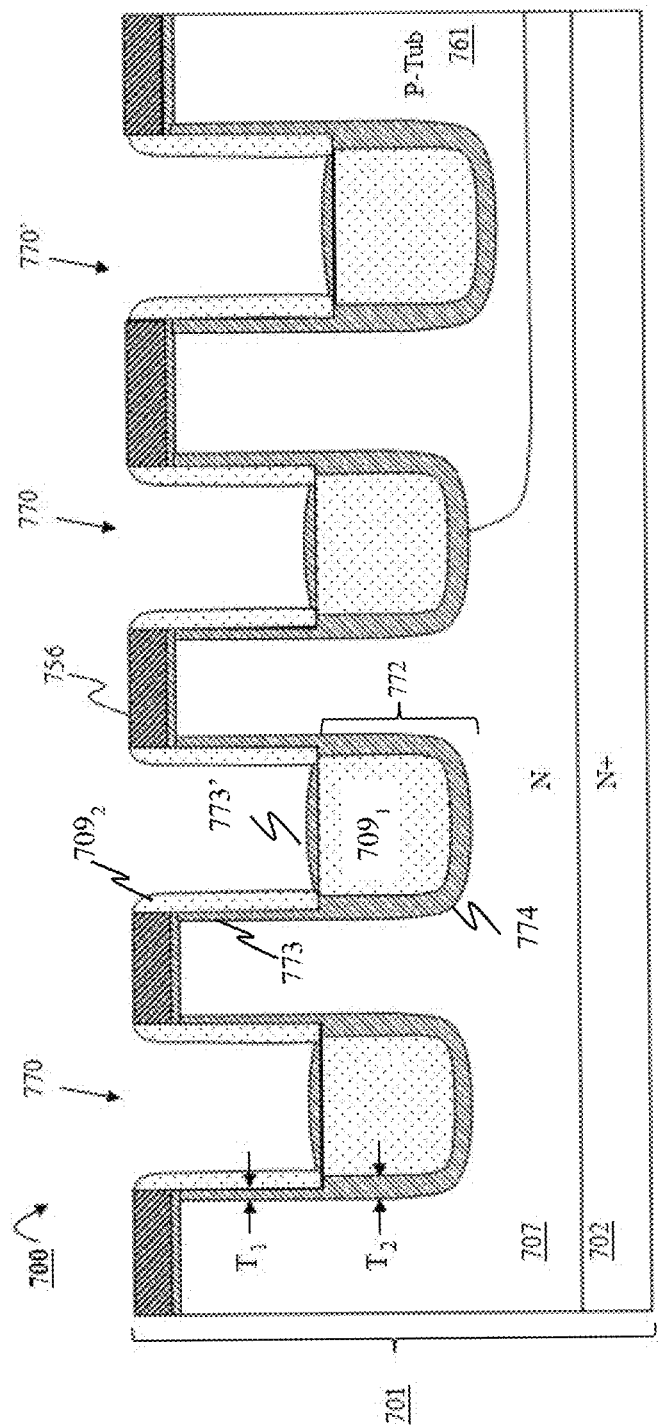
Figure 7E:
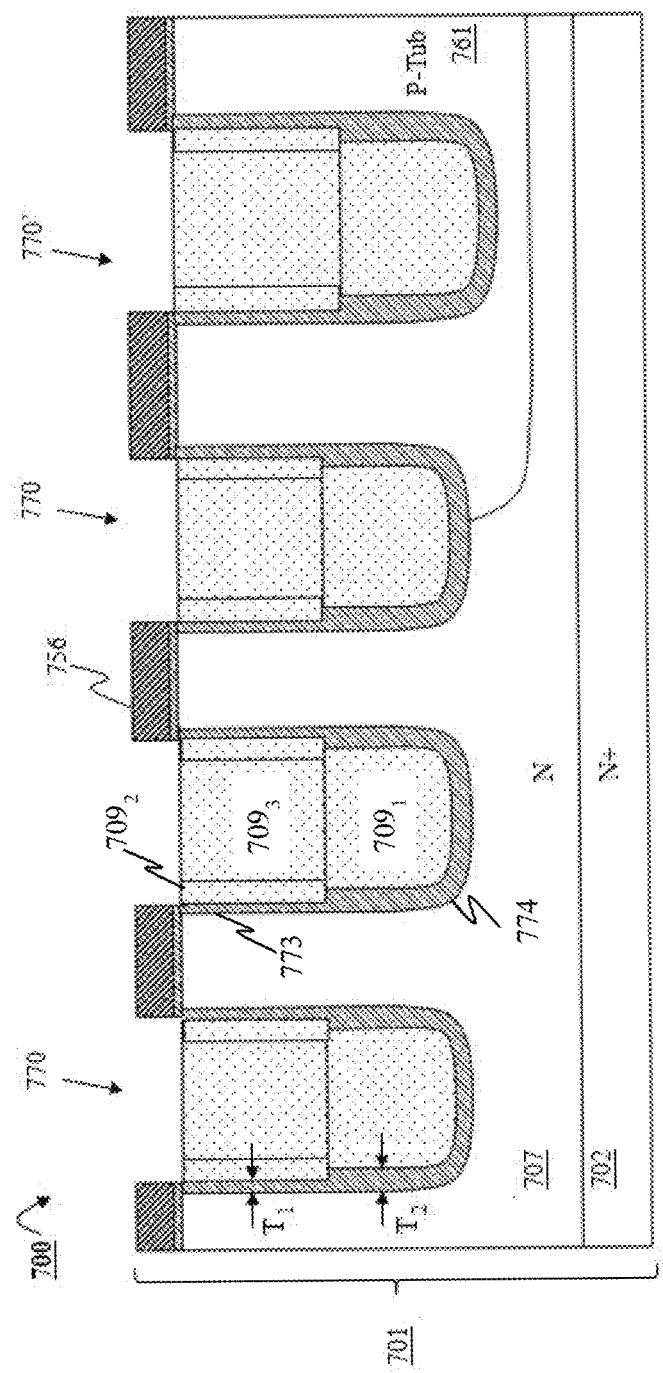

Therefore, in FIG. 7D a second portion of conductive material 709$_2$ may be used to fill the trench 770. An anisotropic etching process may then be used to partially remove the second portion of the conductive material 709$_2$ leaving only sidewall spacers that protect the upper insulation layer 773 from subsequent etching processes. Next, the unwanted insulation layer 773' may be removed with a suitable etching process. Once removed, the remainder of the trench 770 may be filled with a third portion of the conductive material 709$_3$. Thereafter, the processing may continue according to the same processing as device 500.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A MOSFET device, comprising:
 a semiconductor substrate of a first conductivity type wherein the substrate includes a lightly doped epitaxial region in a top portion of the substrate;
 a body region of a second conductivity type formed in a top portion of the semiconductor substrate, wherein the second conductivity type is opposite the first conductivity type;
 a plurality of active device structures formed from the semiconductor substrate and body region, wherein each active device structure comprises a gate electrode insulated with a gate oxide, wherein an upper portion of the gate oxide is a thickness $T_1$ and a bottom portion of the gate oxide is a thickness $T_2$, wherein $T_2$ is greater than $T_1$; one or more source regions of the first conductivity type formed in a top portion of the body region proximate the gate electrode; an insulative gate cap formed over each gate electrode, wherein an insulating spacer is formed on the sidewalls of the gate cap and a conductive or semiconductor spacer is formed on the exposed side walls of the insulating spacer, an insulative layer over a top surface of the body region; a conductive source metal layer formed over the insulative layer; one or more electrical connections that connect the source metal layer with the one or more source regions, wherein the one or more electrical connections are spaced apart from the gate cap by the insulating spacer.

2. The MOSFET device of claim 1, wherein the conductive or semiconductor spacer is a polysilicon spacer.

3. The MOSFET device of claim 2, wherein the polysilicon spacer is doped with dopants of the first conductivity type.

4. The MOSFET device of claim 3, wherein the source region of the first conductivity type is omitted.

5. The MOSFET device of claim 1, further comprising a sub-body layer, wherein the sub-body layer is a lightly doped region of the second conductivity type formed below the bottom surface of the region.

6. The MOSFET device of claim 5, wherein the sub-body layer extends to a depth below the upper portion of the trench.

7. The MOSFET device of claim 1, further comprising one or more electrostatic discharge (ESD) protection features.

8. The MOSFET device of claim 1, further comprising one or more a gate pickup trenches.

9. The MOSFET device of claim 1, further comprising a Schottky contact.

10. The MOSFET device of claim 9, wherein the Schottky contact is a body clamp structure.

* * * * *